(12) United States Patent
Sumino et al.

(10) Patent No.: US 7,115,940 B2
(45) Date of Patent: Oct. 3, 2006

(54) SEMICONDUCTOR DEVICE

(75) Inventors: Jun Sumino, Hyogo (JP); Satoshi Shimizu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/617,667

(22) Filed: Jul. 14, 2003

(65) Prior Publication Data

US 2005/0275063 A1    Dec. 15, 2005

(30) Foreign Application Priority Data

Jan. 29, 2003    (JP)    ............................. 2003-020357

(51) Int. Cl.
*H01L 29/788*    (2006.01)

(52) U.S. Cl. ...................... 257/315; 257/321; 257/412; 257/506

(58) Field of Classification Search ................ 257/315, 257/321, 506, 510, 411, 412, 900
See application file for complete search history.

(56) References Cited

U.S. PATENT DOCUMENTS

| | | | |
|---|---|---|---|
| 5,773,861 A * | 6/1998 | Chen et al. .................. | 257/316 |
| 6,476,438 B1 * | 11/2002 | Shimizu ...................... | 257/314 |
| 6,515,329 B1 * | 2/2003 | Lee et al. .................... | 257/315 |
| 6,555,427 B1 | 4/2003 | Shimizu et al. | |
| 6,566,224 B1 | 5/2003 | Chang et al. | |
| 6,620,681 B1 * | 9/2003 | Kim et al. .................. | 438/257 |
| 6,646,303 B1 * | 11/2003 | Satoh et al. ................ | 257/321 |
| 6,933,194 B1 * | 8/2005 | Narita et al. ................ | 438/257 |
| 2002/0008278 A1 | 1/2002 | Mori | |
| 2002/0019113 A1 | 2/2002 | Chung | |
| 2002/0055217 A1 * | 5/2002 | Kanamor .................... | 438/221 |
| 2002/0072197 A1 | 6/2002 | Kang et al. | |
| 2002/0096704 A1 | 7/2002 | Fukumoto et al. | |
| 2002/0117706 A1 | 8/2002 | Shimizu | |
| 2002/0132425 A1 | 9/2002 | Song et al. | |
| 2002/0182806 A1 | 12/2002 | Kim | |
| 2002/0190312 A1 | 12/2002 | Lee | |
| 2005/0139908 A1 * | 6/2005 | Sumino et al. ............. | 257/327 |

FOREIGN PATENT DOCUMENTS

| | | |
|---|---|---|
| CN | 1345089 A | 4/2002 |
| DE | 100 45 019 A1 | 4/2002 |

(Continued)

OTHER PUBLICATIONS

Korean Office Action dated September 23, 2005 in corresponding Korean Application No. 10-2003-0066126.
K. Shimizu, et al. "A Novel High-Density $5F^2$ NAND STI Cell Technology Suitable for 256Mbit and 1Gbit Flash Memories," International Electron Device Meeting, Dec. 1997.

(Continued)

*Primary Examiner*—Mark V. Prenty
(74) *Attorney, Agent, or Firm*—McDermott Will & Emery LLP

(57) ABSTRACT

A semiconductor device includes: a silicon substrate, having a main surface, in which trenches are formed; element isolation oxide films filling in trenches; a tunnel oxide film, formed on main surface located between element isolation oxide film and element isolation oxide film, having birds beak portions in birds beak forms that bring into contact with element isolation oxide film and element isolation oxide film, respectively; and a polysilicon film, formed on tunnel oxide film, having a thickness exceeding 0 and being less than 50 nm in an intermediate portion between element isolation oxide film and element isolation oxide film, and being thinner than the above thickness on birds beak portions. Thereby, it is possible to provide a semiconductor device wherein birds beaks are formed in the gate insulating film so as to have the desired dimensions and wherein the gate insulating film has excellent electrical characteristics.

9 Claims, 23 Drawing Sheets

FOREIGN PATENT DOCUMENTS

| | | |
|---|---|---|
| JP | 10-242264 | 9/1998 |
| JP | P2000-315738 A | 11/2000 |
| JP | 2001-077333 A | 3/2001 |
| JP | 2001-284556 A | 10/2001 |
| JP | P2001-332638 A | 11/2001 |
| KR | 2002-0021741 | 3/2002 |

OTHER PUBLICATIONS

Surya Bhattacharya, "Improved Performance and Reliability of Split Gate Source-Side Injected Flash Memory Cells," International Electron Device Meeting, Dec. 1996.

* cited by examiner

SEMICONDUCTOR DEVICE

BACKGROUND OF THE INVENTION

1. Field of the Invention

The present invention generally relates to a semiconductor device, and more particularly to a semiconductor device wherein an oxide film in a birds beak form is formed in a gate insulating film.

2. Description of the Background Art

A LOCOS (Local Oxidation of Silicon) method and an STI (Shallow Trench Isolation) method are generally known as methods for isolating semiconductor elements. According to these isolation methods, the surfaces of the semiconductor substrate that become active regions are exposed by means of etching after the deposition of an isolation oxidation film which becomes an element isolation structure on the semiconductor substrate, and gate insulating films and the like are sequentially formed on those exposed portions.

In this case, however, the sidewall portions of the isolation oxide film are also etched; therefore, there is a possibility that the end portions of the active regions may become indented in the isolation region in the configuration. Thereby, the form of the elements formed in the active regions becomes unstable and this becomes the cause of dispersion in the characteristics of the device. In addition, an electrical field concentration is caused in an indented portion in the case where a gate oxide film is formed in the portion, and a problem arises wherein the electrical characteristics of the device deteriorate. Thus, a manufacturing method for a nonvolatile semiconductor memory device is disclosed in Japanese Patent Laying-Open No. 2000-315738, in order to solve such a problem. In addition to that, Japanese Patent Laying-Open Nos. 10-242264 and 2001-332638 are cited as prior art literatures that disclose manufacturing processes for isolation regions.

According to a method disclosed in Japanese Patent Laying-Open No. 2000-315738, an element isolation region is formed after the formation of a tunnel oxide film and a first polycrystal silicon film forming a part of a floating gate. Then, a second polycrystal silicon film is formed on the first polycrystal silicon film in order to provide a sufficient capacitance coupling between the control gate and the floating gate, and this second polycrystal silicon film extends over the element isolation region.

In addition, an oxidation is carried out so as to generate birds beak in the tunnel oxide film for the purpose of rounding the corners of the element regions. At the time of this oxidation process, the first polycrystal silicon film is oxidized, whereby the end portions thereof are rounded. The portions of the first polycrystal silicon having a rounded form are not removed by means of subsequent vertical etching; therefore, short circuiting is caused between adjacent floating gates. An etching process wherein a plasma oxide film formed in the element isolation region is etched by a predetermined amount by means of isotropic etching is added to the manufacturing process in Japanese Patent Laying-Open No. 2000-315738 in order to prevent the generation of the short circuiting.

As described above, the first polycrystal silicon film is oxidized so as to form birds beak in the tunnel oxide film in order to suppress the electrical field concentration generating in the end portions of the element regions. However, the end portions of the tunnel oxide film, on which birds beak is formed, have a thickness greater than the predetermined thickness at the time when the tunnel oxide film is initially formed.

Thus, in the case where the portion on which the tunnel oxide film having a predetermined thickness is formed is not sufficiently secured, this causes the failure of the obtaining of the desired electrical characteristics in the tunnel oxide film. In particular, as the miniaturization of semiconductor elements has progressed in recent years, the width of active regions has gradually been scaled down while the width of tunnel oxide films formed in active regions has also become narrower. Therefore, it is important to carry out an oxidation process by appropriately controlling the dimension of the birds beak formed in the tunnel oxide film.

According to the methods disclosed in the prior art, however, the birds beak is formed in the tunnel oxide film through the appropriate selection of the oxidation conditions such as temperature conditions. In such a case, the dimension of the birds beak to be formed cannot be sufficiently controlled, and there is a possibility that the desired electrical characteristics may not be obtained in the tunnel oxide film or that electrical field concentration may be caused in both end portions of the tunnel oxide film.

In addition, according to the prior art, isotropic etching is carried out in order to prevent the generation of short circuiting due to the portions of the first polycrystal silicon film that have not been removed by means of vertical etching. However, it is not preferable to provide such a process because this complicates the manufacturing process.

SUMMARY OF THE INVENTION

It is therefore an object of the present invention to solve the above described problem and to provide a semiconductor device wherein birds beaks having the desired dimensions are formed in a gate insulating film and the gate insulating film has excellent electrical characteristics.

A semiconductor device according to the present invention includes: a semiconductor substrate, having a main surface, in which first and second trenches are formed in the main surface at a distance away from each other; first and second isolation insulating films filling in the first and second trenches; a gate insulating film, formed on the main surface located between the first isolation insulating film and the second isolation insulating film, including silicon, having an end portion in a birds beak form which brings into contact with the first isolation insulating film and the second isolation insulating film, respectively; and a silicon film formed on the gate insulating film, having a thickness exceeding 0 and being less than 50 nm in an intermediate portion between the first isolation insulating film and the second isolation insulating film, and being thinner than the thickness on the end portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings.

First Embodiment

Figure 1:
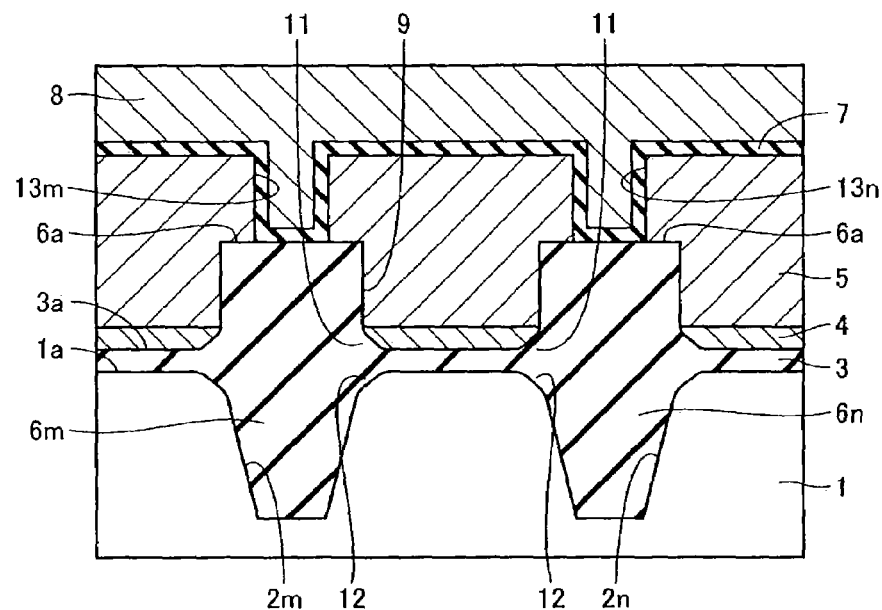
FIG. 1 is a cross sectional view showing a semiconductor device according to a first embodiment of the present invention.

A semiconductor device shown in FIG. 1 forms a flash memory of a nonvolatile semiconductor memory device.

With reference to FIG. 1, trenches 2m and 2n extending in one direction are formed in a main surface 1a of a silicon substrate 1 at a predetermined distance away from each other. Trenches 2m and 2n are formed so that their width becomes greater as the position approaches main surface 1a of silicon substrate 1. Trenches 2m and 2n extend parallel to each other.

Element isolation oxide films 6m and 6n made of silicon oxide films are formed inside trenches 2m and 2n. Element isolation oxide films 6m and 6n fill trenches 2m and 2n and, in addition, extend in the upward direction from main surface 1a of silicon substrate 1. Therefore, top surfaces 6a on element isolation oxide films 6m and 6n are located at a position higher than main surface 1a of silicon substrate 1. Element isolation oxide films 6m and 6n are formed so as to serve as isolation regions for insolating each of the adjacent active regions.

A tunnel oxide film 3 made of a silicon oxide film is formed on main surface 1a of silicon substrate 1 located between element isolation oxide films 6m and 6n so as to have a film thickness of approximately 10 nm. Corner portions at which the sidewalls of element isolation oxide films 6m and 6n filling in trenches 2m and 2n, and main surface 1a of silicon substrate 1 intersect are formed to have rounded forms, and the silicon oxide films filling in these portions form birds beak portions 12. Birds beak portions 12 are formed through the oxidation of the silicon included in silicon substrate 1.

A polysilicon film 4 is formed on tunnel oxide film 3 so as to have a film thickness of 30 nm. Corner portions at which the sidewalls of element isolation oxide films 6m and 6n extending in the upward and downward directions from main surface 1a of silicon substrate 1, and top surface 3a of tunnel oxide film 3 intersect are formed so as to have rounded forms, and the silicon oxide films filling in these portions form birds beak portions 11. Birds beak portions 11 are formed through the oxidation of silicon included in polysilicon film 4.

Birds beak portions 11 and 12 are formed in the portions at which end portions of tunnel oxide film 3, that is, in the portions at which tunnel oxide film 3 brings into contact with element isolation oxide films 6m and 6n. Both end portions of tunnel oxide film 3 have rounded forms without sharp edges due to birds beak portions 11 and 12. It is noted that the top surface of polysilicon film 4 has an approximately flat form wherein forms such as birds beak portions 11 and 12 are not formed.

A recess 9 is formed between the sidewalls of element isolation oxide films 6m and 6n above main surface 1a of silicon substrate 1. A conductive film 5 including silicon is formed so as to fill in this recess 9, to cover parts of top surfaces 6a of element isolation oxide films 6m and 6n and to be connected to polysilicon film 4. Conductive film 5 including silicon is formed from doped polysilicon into which phosphorus (P) is implanted as an impurity. It is noted that conductive film 5 including silicon and polysilicon film 4 form a floating gate electrode.

Recesses 13m and 13n are formed between the sidewalls of conductive film 5 including silicon, above top surfaces 6a of element isolation oxide films 6m and 6n. An ONO film 7 in a three-layer structure is formed of an oxide film, a nitride film and an oxide film so as to cover recesses 13m and 13n as well as the top surface of conductive film 5 including silicon. A control gate 8 is formed so as to completely fill in recesses 13m and 13n and to cover ONO film 7. Control gate 8 is formed from doped polysilicon into which phosphorus is implanted as an impurity.

It is noted that, although not shown, a source region and a drain region are formed in main surface 1a of silicon substrate 1 located on both sides of conductive film 5 including silicon in the direction perpendicular to the surface of the paper. A flash memory cell is formed of the source region, the drain region, tunnel oxide film 3, conductive film 5 including silicon, ONO film 7, and control gate 8.

In addition, although in the present embodiment polysilicon is used for polysilicon film 4 and conductive film 5 including silicon, amorphous silicon instead of polysilicon may be used. It is not necessary to form polysilicon film 4 and conductive film 5 including silicon, of the same material, rather, appropriate materials may be used in combination. In this case, the freedom in design of the structure of the device is increased.

The semiconductor device according to the first embodiment of the present invention includes: silicon substrate 1 as a semiconductor substrate having main surface 1a, in which trenches 2m and 2n, as first and second trenches, are formed at a distance away from each other in this main surface 1a; element isolation oxide films 6m and 6n, as first and second isolation insulating films, filling in trenches 2m and 2n; tunnel oxide film 3, as a gate insulating film including silicon, formed on main surface 1a located between element isolation oxide film 6m and element isolation oxide film 6n and having birds beak portions 11, as end portions in birds beak forms, bringing into contact with element isolation oxide film 6m and element isolation oxide film 6n, respectively; and a polysilicon film 4, as a silicon film, formed on tunnel oxide film 3, having a thickness exceeding 0 and being less than 50 nm in an intermediate portion between element isolation oxide film 6m and element isolation oxide film 6n and having a thickness on birds beak portions 11 which is less than the thickness of the intermediate portion.

The semiconductor device includes: silicon substrate 1, as a semiconductor substrate, having main surface 1a in which trenches 2m and 2n, as first and second trenches, are formed at a distance away from each other in this main surface 1a; element isolation oxide films 6m and 6n, as first and second isolation insulating films, filling in trenches 2m and 2n; tunnel oxide film 3, as a gate insulating film, including silicon, formed on main surface 1a located between element isolation oxide film 6m and element isolation oxide film 6n; and a polysilicon film 4, as a silicon film, formed on tunnel oxide film 3, having a thickness exceeding 0 and being less than 50 nm. Both ends of tunnel oxide film 3 include birds beak portions 11 formed through oxidation of polysilicon film 4 in the positions adjacent to tunnel oxide film 3.

The semiconductor device further includes a conductive film 5, including silicon, as a conductive film including silicon located on top of and is connected to polysilicon film 4. Tunnel oxide film 3 has top surface 3a as a first top surface, and each of element isolation oxide films 6m and 6n has top surface 6a as a second top surface. The distance from main surface 1a to top surface 6a is greater than the distance from main surface 1a to top surface 3a.

In such a configuration, birds beak portions 11 are not eliminated even in the case where top surfaces 6a are lowered due to dispersion or the like in the manufacturing conditions. It is preferable for the distance from main surface 1a to top surfaces 6a to be 20 nm or more in order for birds beak portions 11 not to be eliminated. In addition, the distance needs to be the sum of or more than the sum of the film thicknesses of tunnel oxide film 3 and polysilicon film 4 in order for the floating gate electrode to extend over element isolation oxide films 6m and 6n.

A manufacturing method for the semiconductor device shown in FIG. 1 will be described with reference to FIGS. 1 to 6 and FIGS. 11 to 17.

Figure 2:
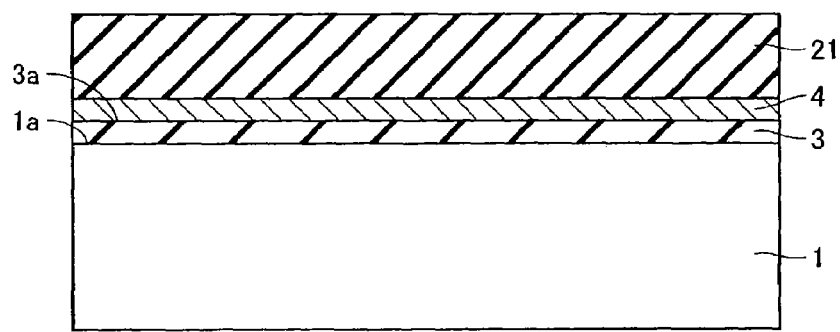
FIGS. 2 to 6 are cross sectional view showing first to fifth steps of a manufacturing method for the semiconductor device shown in FIG. 1.

With reference to FIG. 2, a silicon oxide film having a film thickness of approximately 10 nm is formed on silicon substrate 1 in order to form a tunnel oxide film 3. Subsequently, a polysilicon film 4 including phosphorus as an impurity having a film thickness of 30 nm is deposited on tunnel oxide film 3. At this time, first, a non-doped polysilicon film may be deposited, and phosphorus may subsequently be implanted into this non-doped polysilicon film. Furthermore, a silicon nitride film 21 is deposited on polysilicon film 4.

Figure 3:
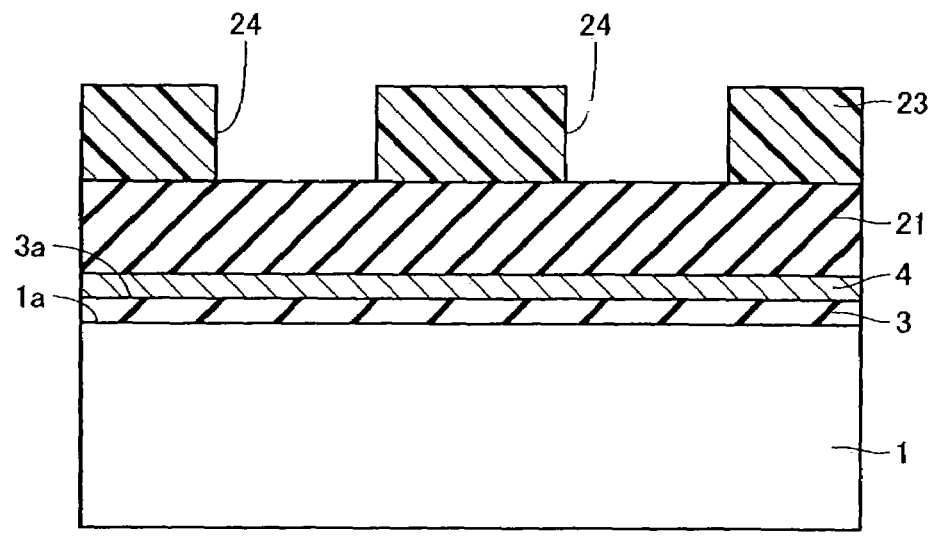
Figure 4:
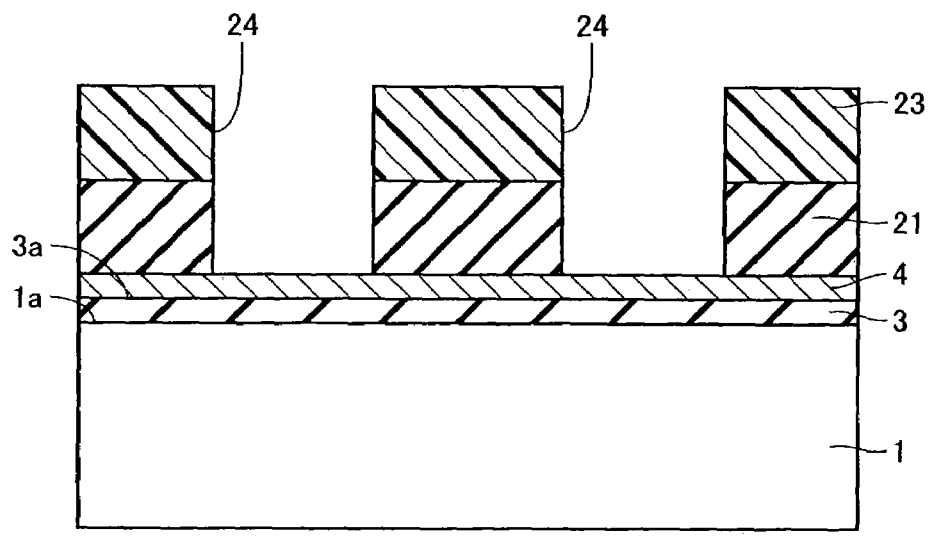

With reference to FIG. 3, a resist film 23 on which openings 24 are formed at a distance away from each other is formed on silicon nitride film 21. With reference to FIG. 4, silicon nitride film 21 is etched using resist film 23 as a mask. Thereby, the portions of silicon nitride film 21 exposed from resist film 23 are removed through openings 24. After that, resist film 23 is removed.

Figure 5:
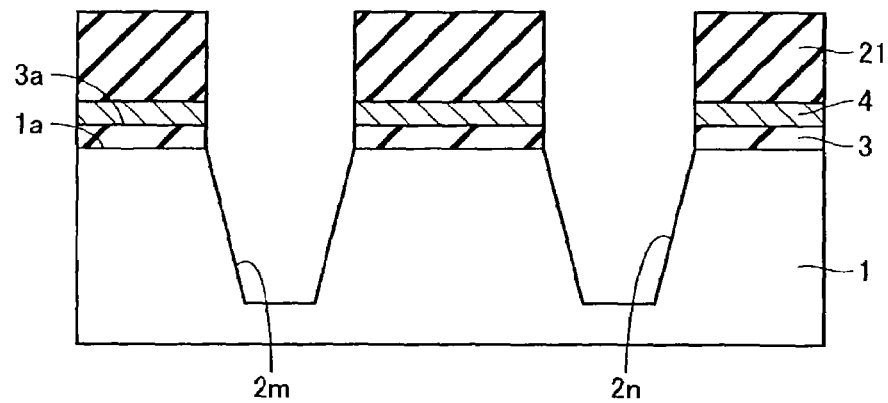

With reference to FIG. 5, polysilicon film 4, tunnel oxide film 3 and silicon substrate 1 are sequentially etched using silicon nitride film 21 as a mask so as to form trenches 2m and 2n in silicon substrate 1 having predetermined forms.

Figure 6:
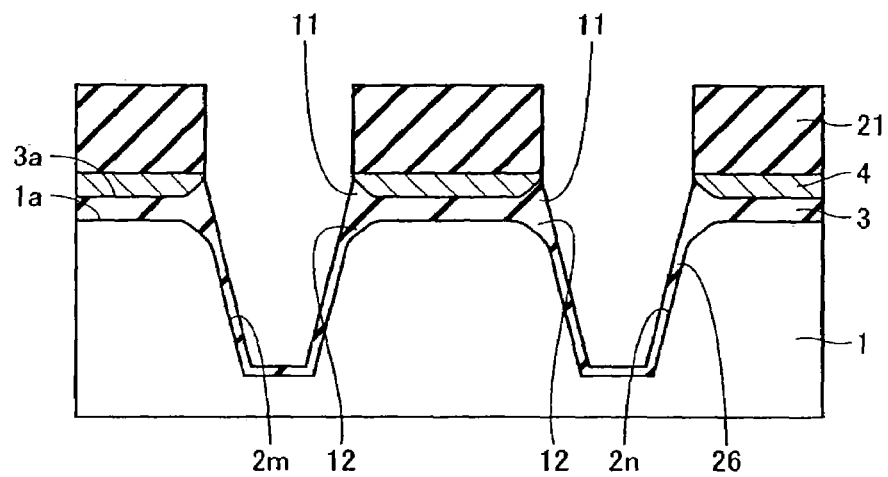

With reference to FIG. 6, an oxidation process is carried out on the inner walls of trenches 2m and 2n by means of a thermal oxidation method. According to this oxidation process, inner wall oxide films 26 are formed on the sidewalls and on the bottom face of trenches 2m and 2n. In addition, silicon substrate 1 is oxidized to be in rounded forms at the corner portions between trenches 2m and 2n and main surface 1a of silicon substrate 1, so that birds beak portions 12 are formed on these portions. Furthermore, polysilicon film 4 is oxidized to have rounded forms at positions at which both ends of polysilicon film 4 adjoin tunnel oxide film 3, so that birds beak portions 11 are formed on these portions.

Although in the present embodiment the thickness of polysilicon film 4 is 30 nm, the dimensions of birds beak portions 11 can be freely controlled by adjusting the film thickness of polysilicon film 4 in the range exceeding 0 and being less than 50 nm. That is to say, the dimensions of birds beak portions 11 can be increased by increasing the thickness of polysilicon film 4 within a predetermined range and the dimensions of birds beak portions 11 can be reduced by reducing the thickness of polysilicon film 4.

In addition, the dimensions of birds beak portions 11 can be further freely controlled by appropriately adjusting both the oxidation conditions in the oxidation process and the thickness of polysilicon film 4.

The present inventors have perceived that the dimensions of birds beak portions 11 cannot be further increased at this time even when the thickness of polysilicon film 4 is increased to a value of 50 nm or more. In addition, in the case where the thickness of polysilicon film 4 is greater than 50 nm, there is a possibility that short circuiting may be caused between conductive films 5, including silicon, which are aligned adjacent to each other in the direction perpendicular to the surface of the paper.

Figure 7:
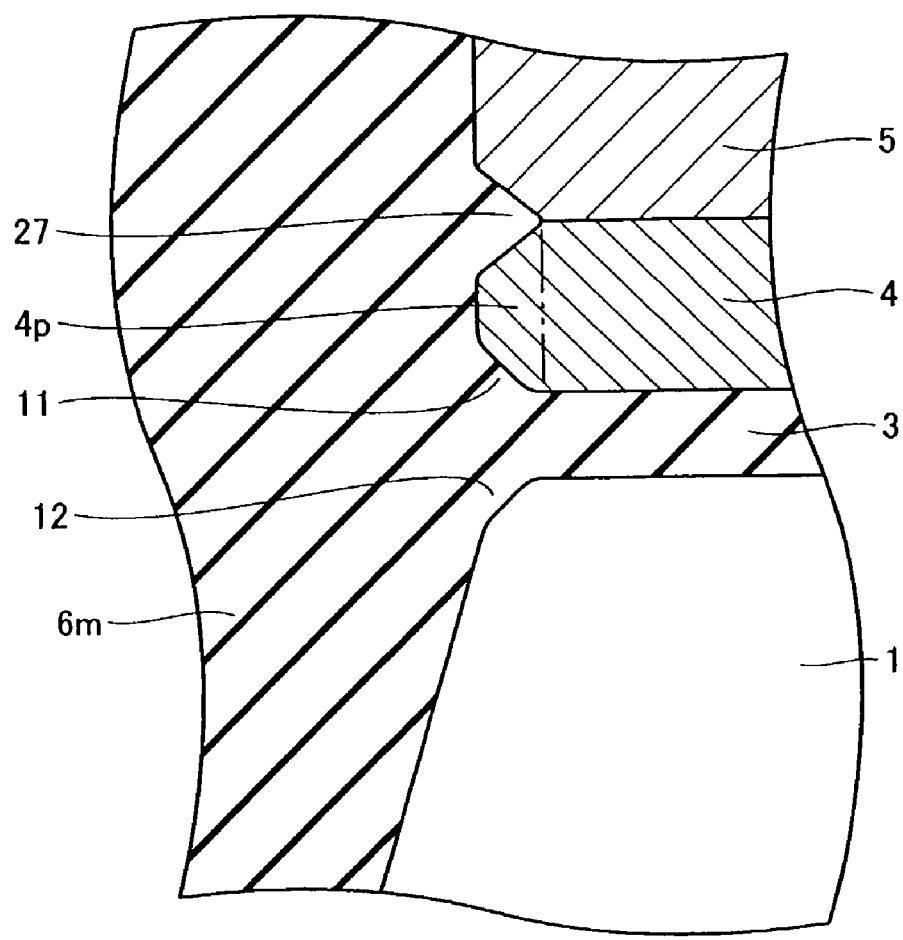
FIG. 7 is a cross sectional view for describing short circuiting caused between adjacent floating gates.

With reference to FIG. 7, polysilicon film 4 is formed having a film thickness of 50 nm or more. Both end portions of polysilicon film 4 are oxidized because the thickness of polysilicon film 4 is great so that birds beak portions 27 are formed on the top surface side of polysilicon film 4, that is, on the side wherein polysilicon film 4 and conductive film 5 including silicon bring into contact with each other.

In such a case, a polysilicon film 4p, located between a birds beak portion 27 formed on the top surface side of polysilicon film 4 and a birds beak portion 11 formed on the bottom surface side of polysilicon film 4, remains unetched at the time of vertical etching that separates conductive film 5 including silicon in the direction perpendicular to the surface of the paper. Therefore, there is a possibility that adjacent polysilicon films 4, which should have been separated, may be short-circuited.

Figure 8:
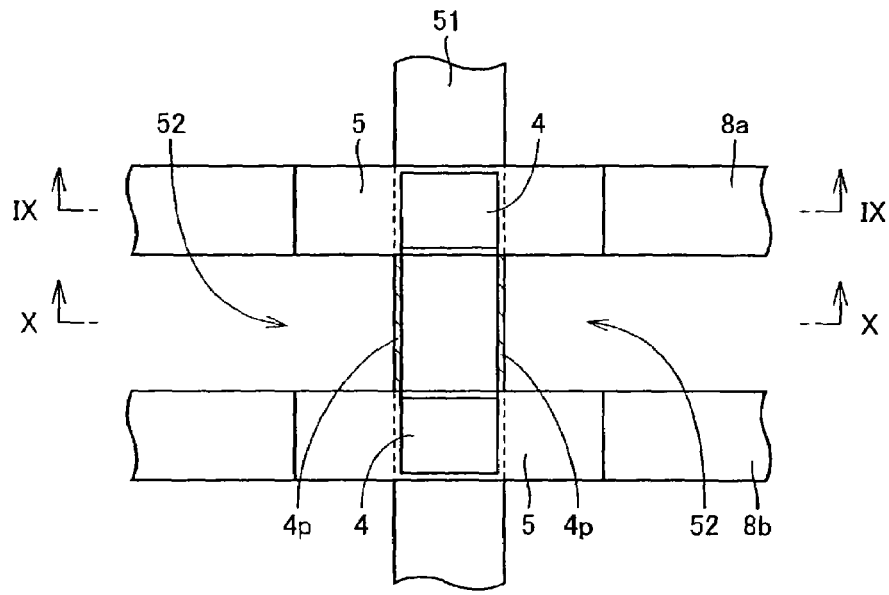
FIG. 8 is a plan view showing a semiconductor device in which short circuiting is caused due to a polysilicon film.
Figure 9:
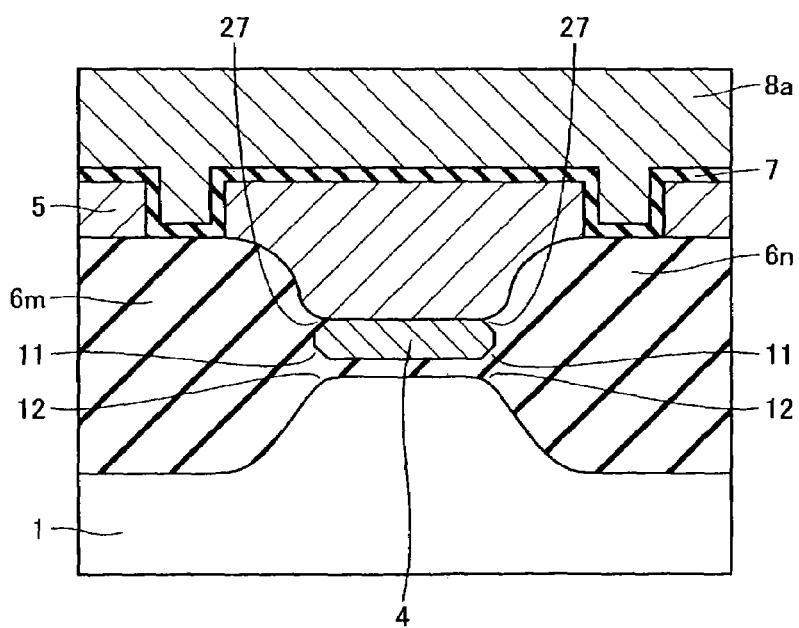
FIG. 9 is a cross sectional view taken along line IX—IX of FIG. 8.

With reference to FIGS. 8 and 9, an active region 51 is formed so as to extend in one direction. Control gates 8a and 8b having conductive film 5 including silicon and polysilicon film 4 located in the lower layer of the control gates, respectively, are formed so as to extend in the direction approximately perpendicular to the direction in which active region 51 extends. Control gates 8a and 8b are separated from each other by isolation region 52. Birds beak portions 27 are formed on the sides of the area of contact between polysilicon film 4 and conductive film 5 including silicon.

Figure 10:
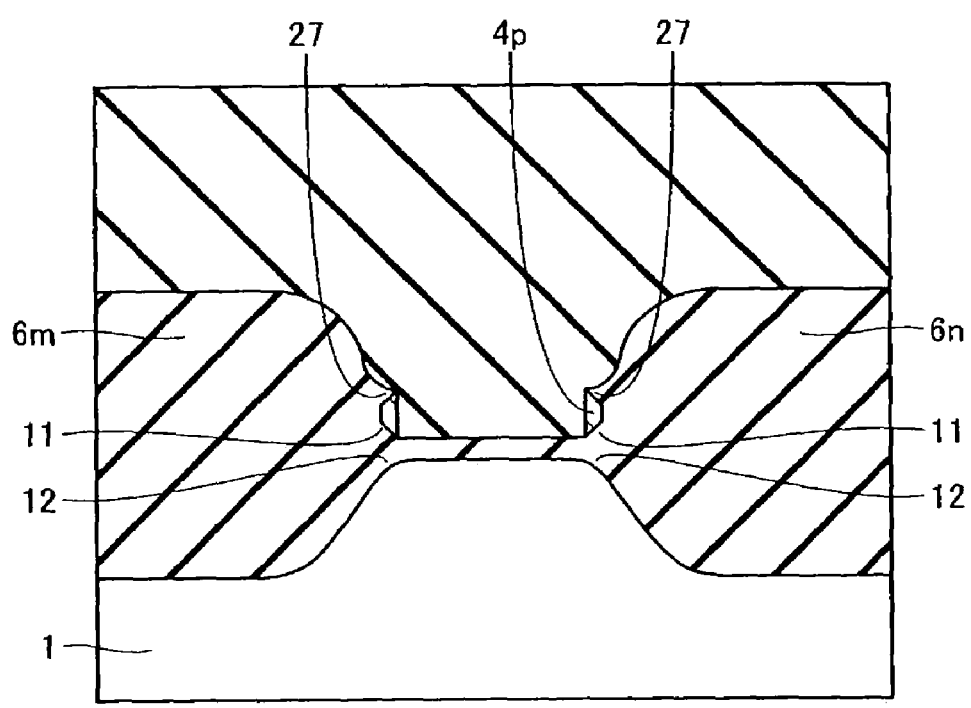
FIG. 10 is a cross sectional view taken along line X—X of FIG. 8.

With reference to FIGS. 8 and 10, polysilicon film 4 remains unetched beneath birds beak portions 27 in isolation region 52, whereby polysilicon films 4p are provided. Polysilicon films 4 provided as the lower layers of control gates 8a and 8b, respectively, are electrically connected to each other by means of polysilicon films 4p. Thereby, short circuiting is caused between adjacent polysilicon films 4.

It becomes necessary, due to the above described reasons, to adjust the thickness of polysilicon film 4 to be in a range exceeding 0 and being less than 50 nm in order to form birds beak portions 11 having desired dimensions.

In the case where polysilicon film 4 forming a floating gate electrode has a film thickness of 50 nm or less in the flash memory, a sufficient capacitance between the floating gate electrode and the control gate electrode cannot be attained on the sidewalls of the floating gate electrode; therefore, conductive film 5 including silicon is additionally formed so as to be connected to polysilicon film 4. Here, it is desirable for conductive film 5 including silicon to have a thickness from approximately 50 nm to 200 nm taking into consideration trade-offs such as in regard to etching.

Figure 11:
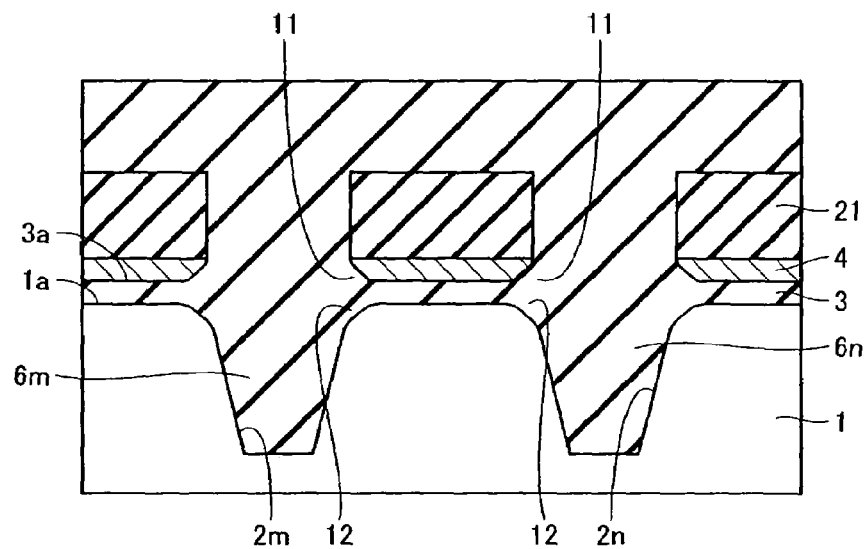
FIGS. 11 to 17 are cross sectional view showing sixth to twelfth steps of a manufacturing method for the semiconductor device shown in FIG. 1.

With reference to FIG. 11, a silicon oxide film is deposited so as to fill in trenches 2m and 2n and so as to cover the top surface of silicon nitride film 21 according to a plasma CVD (Chemical Vapor Deposition) method in order to form element isolation oxide films 6m and 6n.

Figure 12:
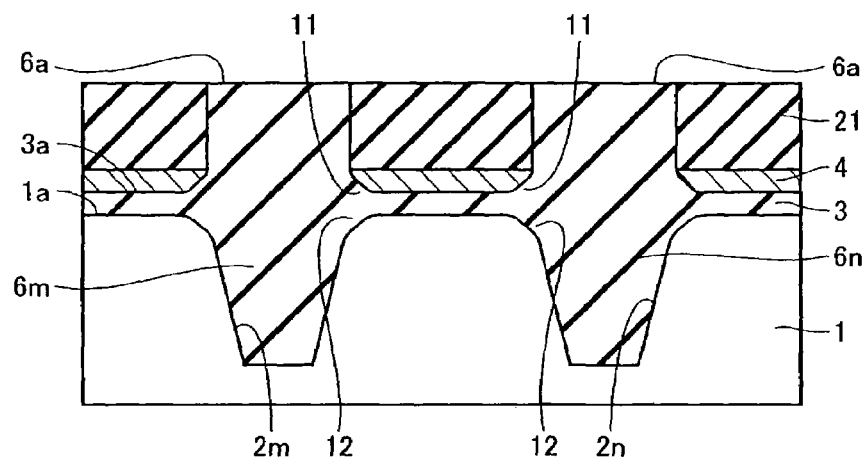

With reference to FIG. 12, the silicon oxide film deposited in the step shown in FIG. 11 is polished by means of a chemical mechanical polishing method (CMP) until at least the top surface of silicon nitride film 21 is exposed. Thereby, element isolation oxide films 6m and 6n filling in trenches 2m and 2n and which have top surfaces 6a formed in the same plane as the top surface of silicon nitride film 21 are formed.

It is possible to adjust the height of the isolation oxide films to a desired value by additionally using hydrofluoric acid in an oxide film removal step carried out on element isolation oxide films 6m and 6n.

Figure 13:
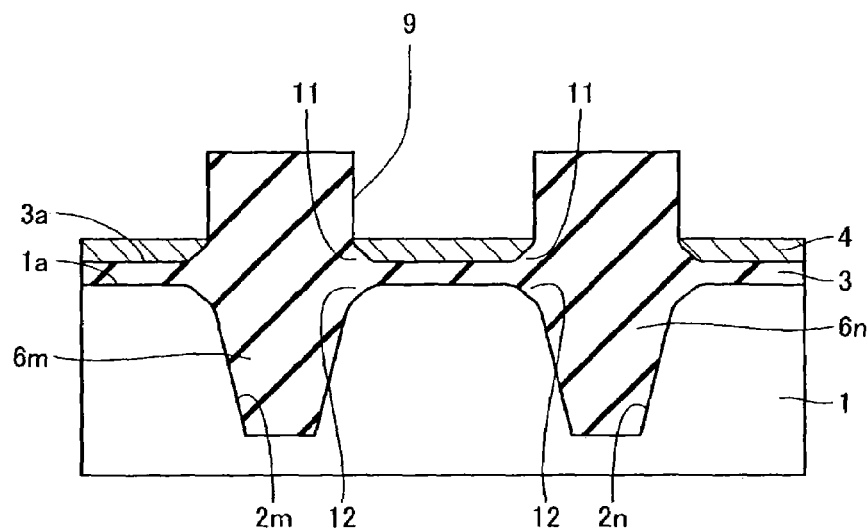

With reference to FIG. 13, silicon nitride film 21 exposed by polishing the silicon oxide film is selectively removed using hot phosphoric acid or the like. Thereby, a recess 9 is formed between element isolation oxide films 6m and 6n located in main surface 1a of silicon substrate 1.

A vitrification step for the plasma CVD film may be additionally carried out after the removal of silicon nitride film 21 in order to form the element isolation oxide films. Thereby, impurities such as hydrogen can be prevented from diffusing, as might be expected, from the silicon nitride film by carrying out vitrification immediately after the formation of the conventional plasma CVD film. Thereby, the reliability of the tunnel oxide film can be increased.

Figure 14:
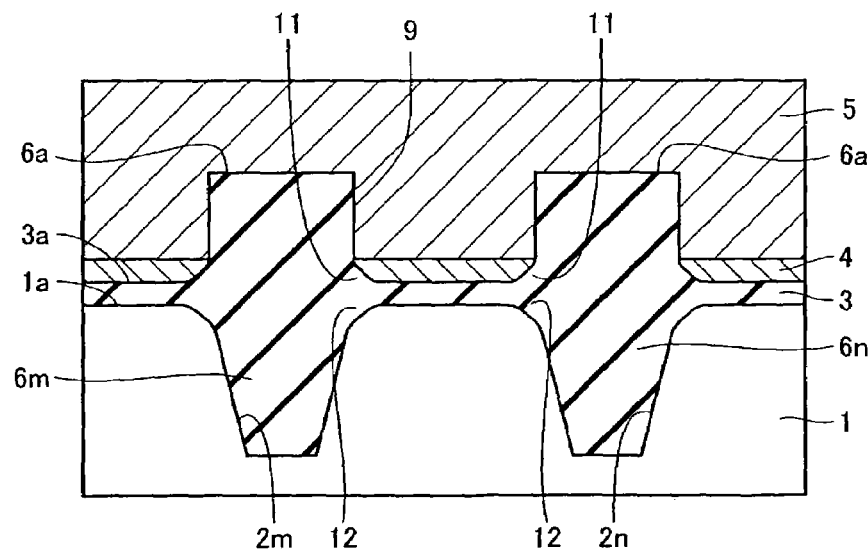

With reference to FIG. 14, a polysilicon film including phosphorus as an impurity is deposited so as to fill in recess 9 and to cover top surfaces 6a of element isolation oxide films 6m and 6n in order to form conductive film 5 including silicon. At this time, first, a non-doped polysilicon film may be deposited and, after that, phosphorus may be implanted to this non-doped polysilicon film.

Figure 15:
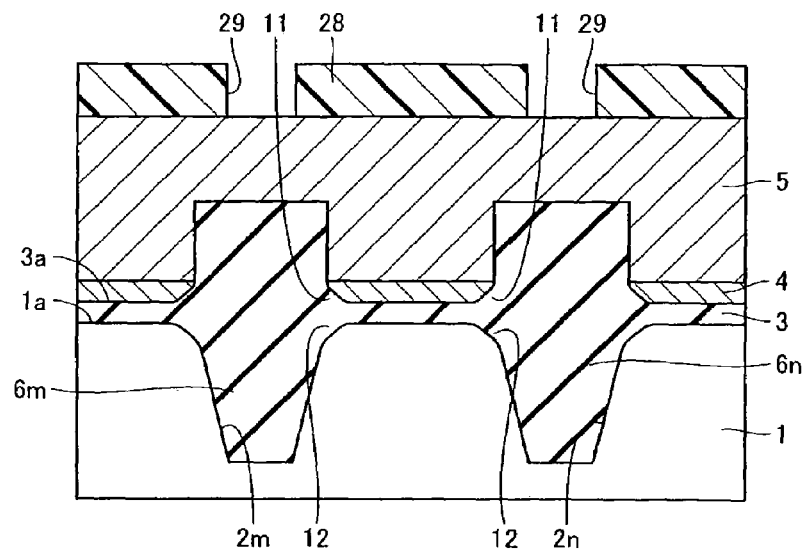
Figure 16:
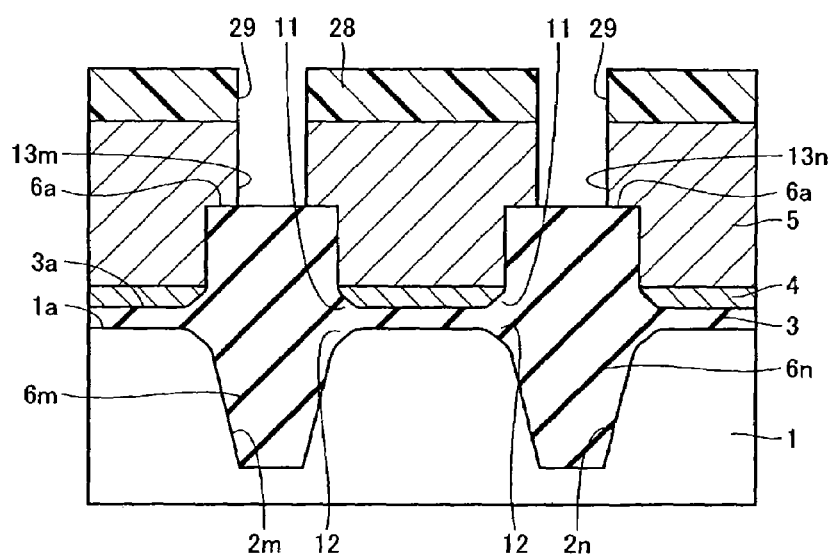

With reference to FIG. 15, a resist film 28 having openings 29 above element isolation oxide films 6m and 6n is formed over the polysilicon film deposited in the step shown in FIG. 14. With reference to FIG. 16, the polysilicon film is etched using resist film 28 as a mask and a conductive film 5, including silicon, having a predetermined form is formed. Recesses 13m and 13n, of which the sidewalls are defined by conductive film 5 including silicon are formed above top surfaces 6a of element isolation oxide films 6m and 6n. After that, resist film 28 is removed.

Figure 17:
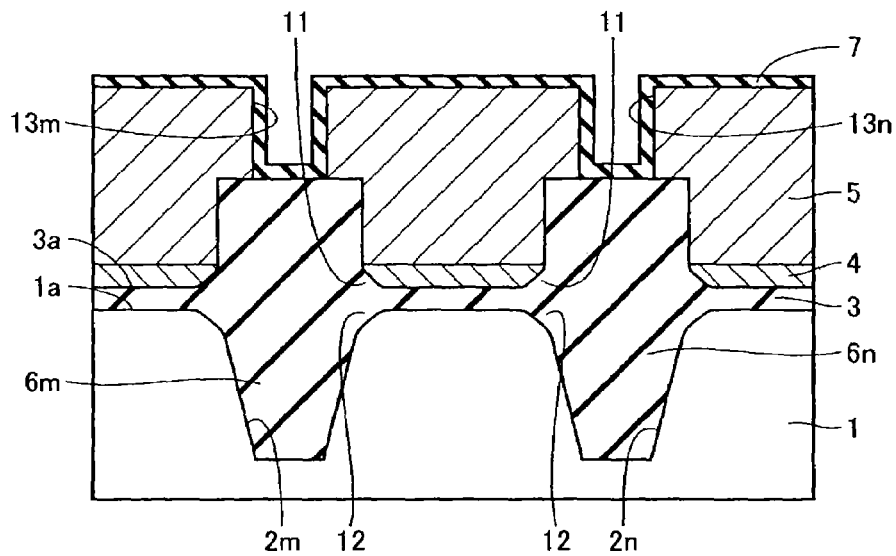

With reference to FIG. 17, an ONO film 7 is formed so as to cover recesses 13m and 13n as well as the top surfaces of conductive film 5 including silicon. With reference to FIG. 1, a polysilicon film including phosphorus as an impurity is deposited so as to completely fill in recesses 13m and 13n and to cover ONO film 7, whereby control gate 8 is formed. The semiconductor device shown in FIG. 1 is completed according to the above described process.

Here in the present embodiment, tunnel oxide film 3 is formed on main surface 1a of silicon substrate 1 after the formation of element isolation oxide films 6m and 6n having top surfaces 6a at positions higher than main surface 1a of silicon substrate 1. Therefore, the forms of the end portions of tunnel oxide film 3 do not become indented in the isolation regions. Thereby, tunnel oxide film 3 has a form that does not allow an electrical field concentration to generate so that a semiconductor device having the desired electrical characteristics can be implemented.

The manufacturing method for a semiconductor device according to the first embodiment of the present invention includes the steps of: forming tunnel oxide film 3 on main surface 1a of silicon substrate 1; forming polysilicon film 4 having a thickness exceeding 0 and being less than 50 nm on tunnel oxide film 3; forming silicon nitride film 21 on polysilicon film 4 as a mask for exposing polysilicon film 4 at positions, respectively, located at a distance away from each other; sequentially etching polysilicon film 4, tunnel oxide film 3 and silicon substrate 1 using silicon nitride film 21 as a mask, thereby exposing the sidewalls of polysilicon film 4 while forming trenches 2m and 2n in silicon substrate 1; and oxidizing the sidewalls of polysilicon film 4, thereby forming birds beak portions 11 at positions adjacent to tunnel oxide film 3.

The manufacturing method for a semiconductor device further includes the steps of: forming element isolation oxide films 6m and 6n filling in trenches 2m and 2n after the step of forming birds beak portions 11; removing silicon nitride film 21; and forming conductive film 5 including silicon so as to cover polysilicon film 4 as well as element isolation oxide films 6m and 6n.

The experiment which will be shown below was carried out in order to confirm the relationship between the thickness of polysilicon film 4 formed on tunnel oxide film 3 and birds beak portions 11 formed in the tunnel oxide film.

Figure 18:
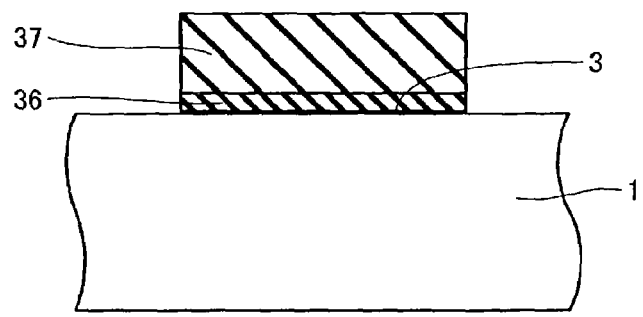
FIGS. 18 to 20 are cross sectional views showing the steps of forming birds beak in a tunnel oxide film.

With reference to FIG. 18, tunnel oxide film 3 made of a silicon oxide nitride film (SiON), an amorphous silicon film 36 as polysilicon film 4 in FIG. 1, and a silicon nitride film (SiN) 37 are sequentially formed above silicon substrate 1. At this time, amorphous silicon film 36 having three different thicknesses was formed. A resist film, not shown, having a predetermined pattern form was formed on silicon nitride film 37. Etching was carried out using this resist film as a mask, whereby tunnel oxide film 3, amorphous silicon film 36 and silicon nitride film 37 were formed to have predetermined forms.

Figure 19:
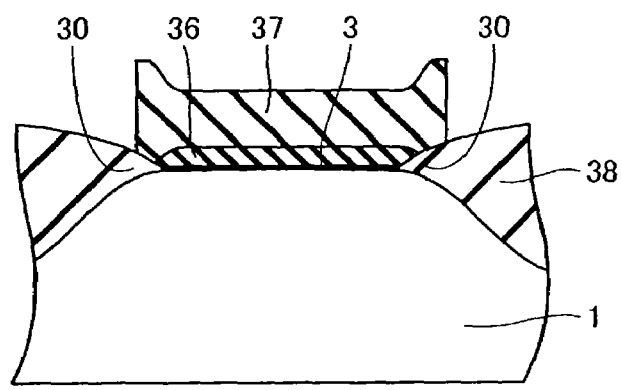
Figure 20:
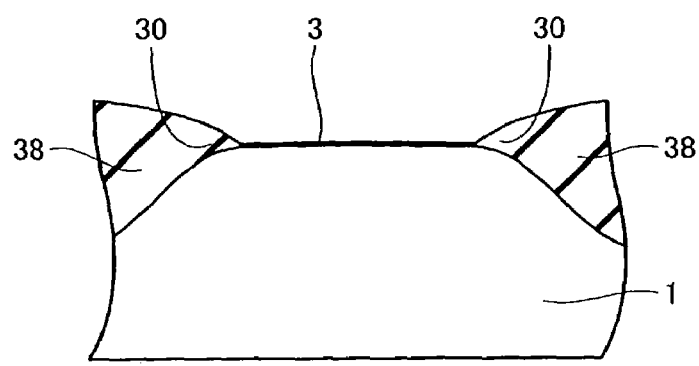

With reference to FIG. 19, an oxidation process was carried out on the structure obtained according to the step shown in FIG. 18. Thereby, isolation oxide films 38 were formed in silicon substrate 1 so as to continue to tunnel oxide film 3 according to a LOCOS isolation method. Birds beak portions 30, in birds beak forms, were formed in the portions wherein isolation oxide films 38 and tunnel oxide film 3 were connected. With reference to FIG. 20, silicon nitride film 37 and amorphous silicon film 36 were sequentially removed.

Figure 21:
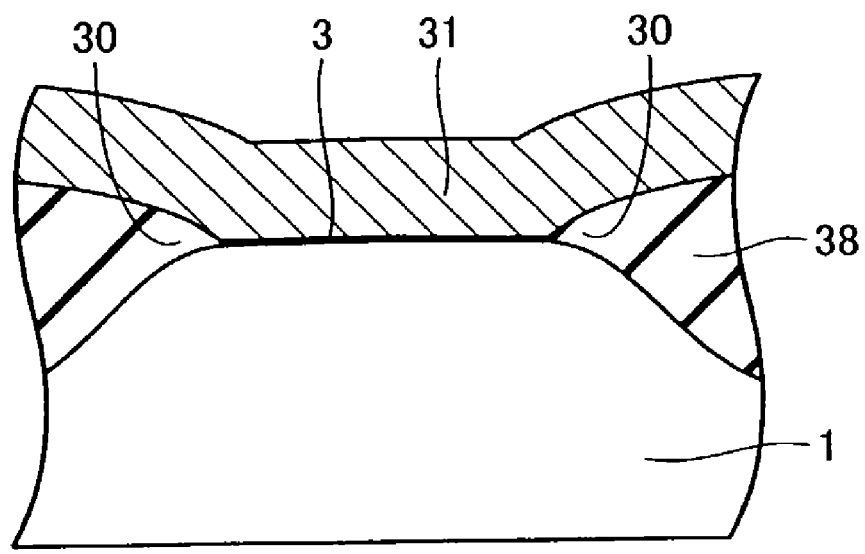
FIGS. 21 to 23 are views showing the form of the birds beak formed in the tunnel oxide film in the steps shown in FIGS. 18 to 20.
Figure 22:
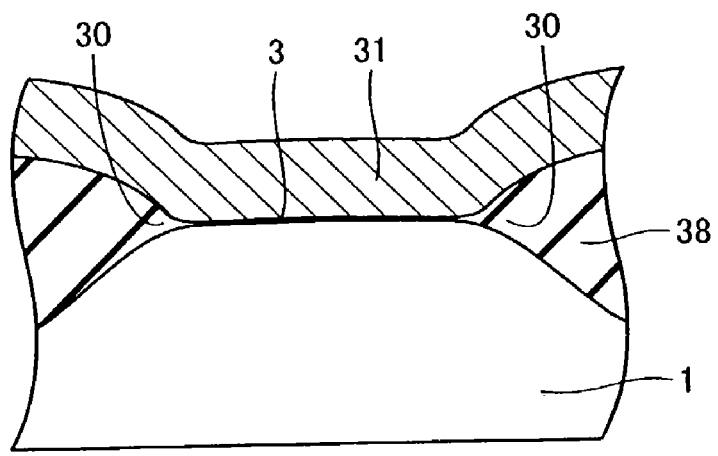
Figure 23:
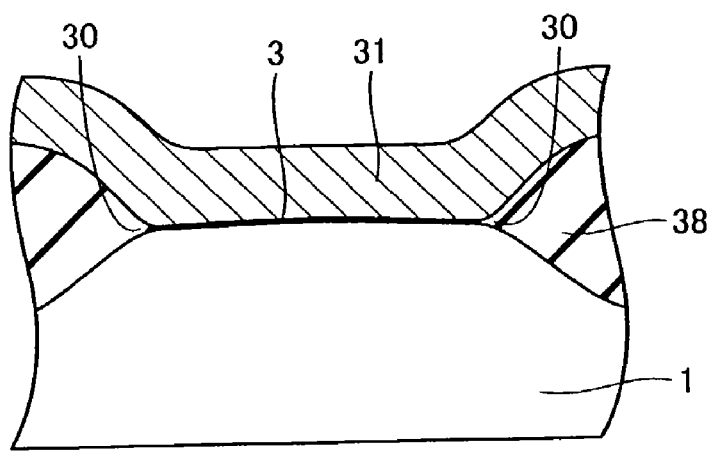

With reference to FIGS. 21 to 23, birds beak portions 30 shown in FIGS. 21, 22 and 23 were obtained in the case where the film thickness of amorphous silicon film 36, shown in FIG. 18, was 30 nm, 50 nm and 70 nm. It is noted that an amorphous silicon film 31 was formed after the step shown in FIG. 20 on top of tunnel oxide film 3 and isolation oxide films 38.

In the case where the angles formed in the birds beak portions 30, in birds beak forms, are compared, the angle in birds beak portions 30 shown in FIG. 22 is greater than the angle in birds beak portions 30 shown in FIG. 21. In addition, the angles in birds beak portions 30 shown in FIGS. 22 and 23 do not greatly differ. According to the above described results, it was confirmed that the greater is the thickness of amorphous silicon film 36, shown in FIG. 18, the greater becomes the angle in birds beak portions 30, while in the case where the thickness of amorphous silicon film 36 is 50 nm or more, the dimensions of birds beak portions 30 do not substantially differ from each other.

According to the semiconductor device in the above described configuration and according to the manufacturing method for the same, an oxidation process is carried out on the inner walls of trenches 2m and 2n under the condition that polysilicon film 4 is deposited on tunnel oxide film 3. Therefore, the thickness of polysilicon film 4 is adjusted to be in a predetermined range, whereby the dimensions of birds beak portions 11 can be freely controlled. Thereby, an electrical field concentration can be prevented from occurring at the end portions of tunnel oxide film 3 and, at the same time, tunnel oxide film 3 is formed, without fail, wherein a portion thereof has a predetermined film thickness so that a semiconductor device having desired electrical characteristics can be implemented.

Second Embodiment

A semiconductor device according to a second embodiment of the present invention has basically similar structure to that of the semiconductor device according to the first embodiment. Here, in the semiconductor device according to the second embodiment, polysilicon film 4 shown in FIG. 1 includes phosphorus.

With reference to FIG. 2, polysilicon film 4, which includes phosphorus as an impurity, is deposited on tunnel oxide film 3 so as to have a film thickness of 30 nm in the semiconductor device according to the second embodiment. At this time, the concentration of phosphorus included in polysilicon film 4 is adjusted to a range of no greater than $4 \times 10^{20}$ cm$^{-3}$. It is known that the oxidation rate of polysilicon film 4 can be altered by varying the phosphorus concentration in polysilicon film 4. In general, the lower the phosphorus concentration is, the lower the oxidation rate of polysilicon film 4 becomes while the greater the phosphorus concentration is, the higher the oxidation rate of polysilicon film 4 becomes. Here, the upper limit value of the phosphorus concentration exists as described below according to the above described relationship between the phosphorus concentration and the oxidation rate of polysilicon film 4.

Figure 24:
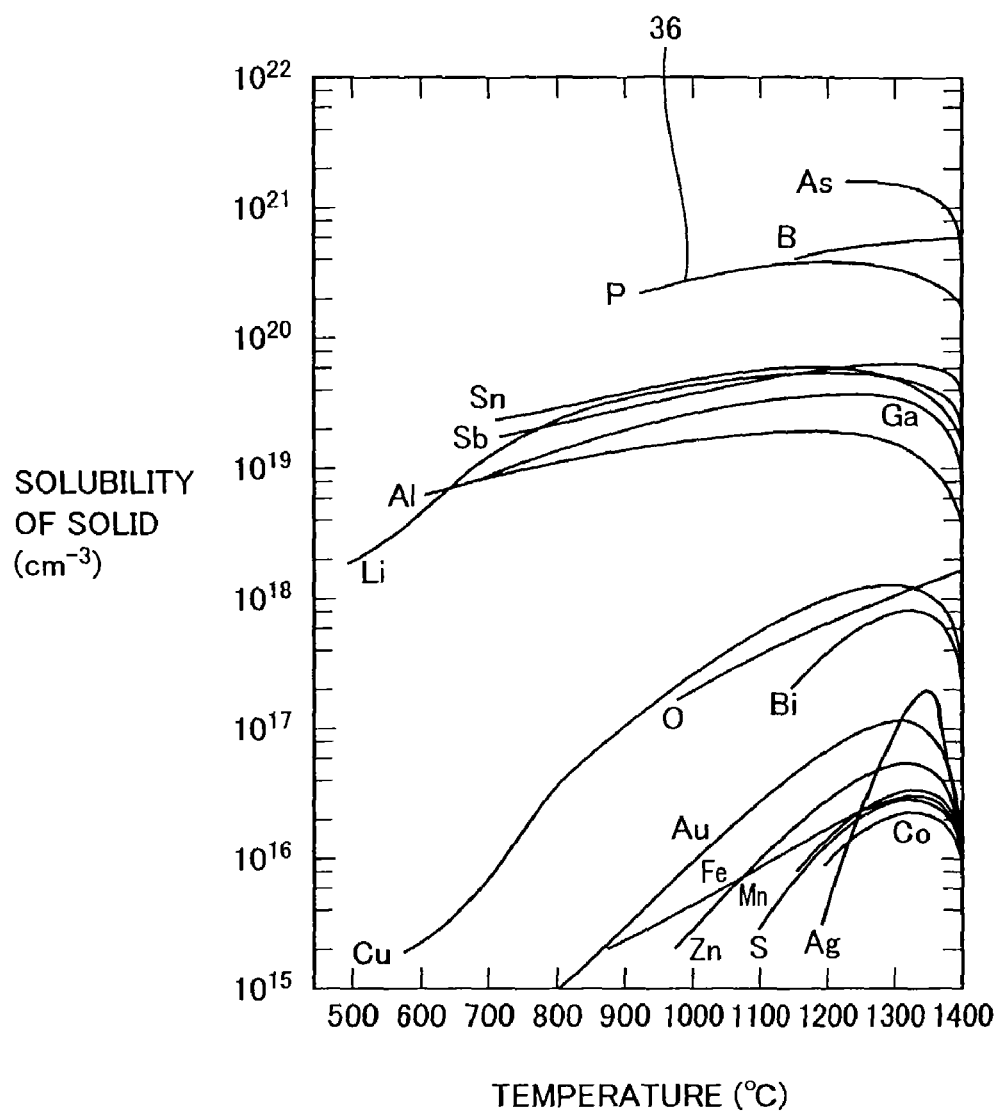
FIG. 24 is a graph showing the relationship between the solubility of a solid in silicon and temperature.

FIG. 24 is a graph showing the relationship between the solubility of a solid in silicon and temperature (reference: "Physics and Technology of Semiconductor Devices" by A. S. GROVE). With reference to FIG. 24, the temperature (unit: ° C.) is shown along the lateral axis while the solubility of the solid (unit: cm$^{-3}$) is shown along the longitudinal axis. Curve 36 in FIG. 24 shows the relationship between the concentration of phosphorus that can be solved in silicon and the temperature thereof in the case where phosphorus is implanted in silicon at a specific temperature.

As is seen from curve 36, the higher the temperature becomes, the greater becomes the concentration of phosphorus that can be solved in silicon and the concentration of phosphorus that can be solved in silicon at a temperature in the vicinity of 1200° C. becomes $4 \times 10^{20}$ cm$^{-3}$. However, the concentration of phosphorus that can be solved in silicon cannot be increased even in the case where the temperature is further increased and, in fact, the phosphorus concentration becomes lower.

Due to the above described reasons, the oxidation rate of polysilicon film 4 can be altered by adjusting the concentration of phosphorus implanted into polysilicon film 4 to a range of no greater than $4 \times 10^{20}$ cm$^{-3}$. Thus, the dimensions of birds beak portions 11 formed in polysilicon film 4 can be freely controlled via the oxidation rate of polysilicon 4. In addition) the combination of the oxidation conditions in the oxidation process shown in FIG. 6, the thickness of polysilicon film 4 and the concentration of phosphorus implanted into polysilicon film 4 can be appropriately selected, whereby the dimensions of the formed birds beak portions 11 can be further freely controlled.

According to a semiconductor device of such a configuration, the same effects as the effects described in the first embodiment can be obtained. In addition, the parameter of the concentration of phosphorus implanted to polysilicon film 4 can be used to control the dimensions of birds beak portions 11 in the second embodiment. Therefore, birds beak portions 11 can be formed to have predetermined forms with even greater freedom of design. Here, in the case where the polysilicon film requires conductivity, it is preferable for the phosphorus concentration to be on the order of $10^{20}$ cm$^{-3}$.

Here, though in the present embodiment phosphorus is implanted as an impurity into polysilicon film 4, an impurity such as arsenic (As) or boron (B) may be implanted in accordance with the structure of the semiconductor device. In these cases, also, the lower is the concentration of the impurity, the lower is the oxidation rate of polysilicon film 4 and the higher is the concentration of the impurity, the greater is the oxidation rate of polysilicon film 4. Accordingly, the dimensions of birds beak portions 11 can be freely controlled by adjusting the concentration of the impurity injected into polysilicon film 4. In addition, in the case where polysilicon film 4 is formed of non-doped polysilicon, the formation of birds beak portions 11 can be further positively suppressed.

Figure 25:
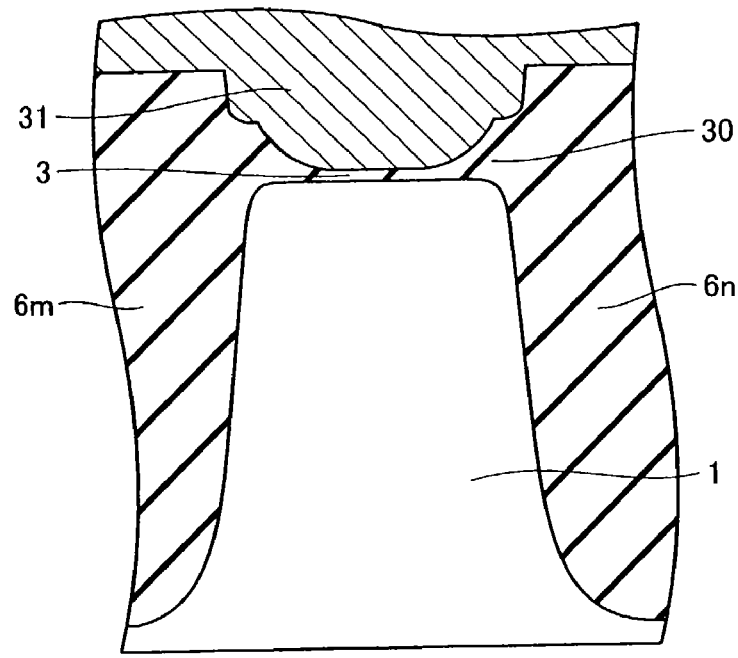
FIGS. 25 and 26 are cross sectional views showing the forms of birds beaks in the case where the impurity concentration implanted into the polysilicon film on the tunnel oxide film is adjusted.
Figure 26:
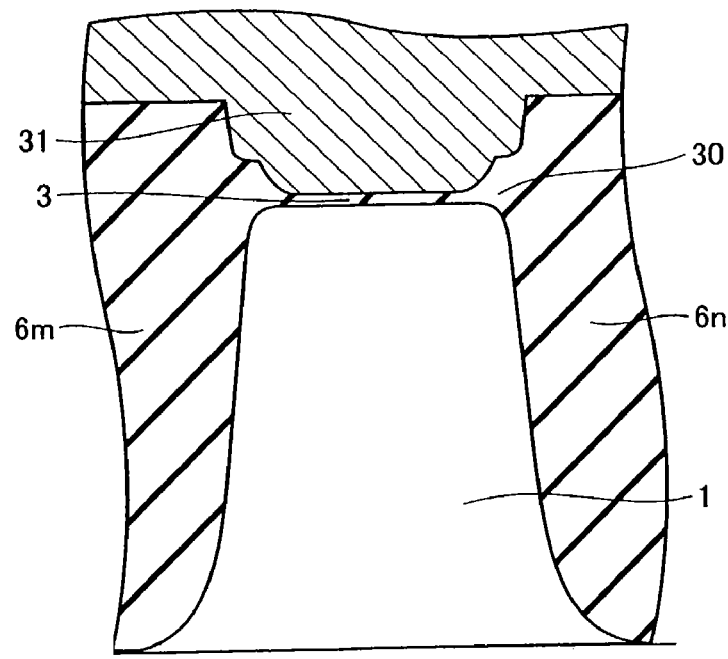

With reference to FIGS. 25 and 26, birds beak portions 30 were formed in tunnel oxide film 3 on silicon substrate 1 according to the manufacturing method for a semiconductor device of the first and second embodiments and the formation of birds beak portions 30 was observed with an electron microscope. Here, amorphous silicon film 31 was used as polysilicon film 4, shown in FIG. 1. Though the film thicknesses of the amorphous silicon films 31 shown in FIGS. 25 and 26 are the same, the amorphous silicon film 31 shown in FIG. 25 is formed of doped amorphous silicon, into which phosphorus has been implanted at a concentration of $1\times10^{20}$ cm$^{-3}$ while the amorphous silicon film 31 shown in FIG. 26 is formed of non-doped amorphous silicon.

In the case where birds beak portions 30 in FIGS. 25 and 26 are compared, birds beak portions 30 shown in FIG. 25 are formed to have greater dimensions than do birds beak portions 30 shown in FIG. 26. Accordingly, it was confirmed that the formation of birds beak portions 30 could be suppressed by utilizing amorphous silicon film 31 formed of non-doped amorphous silicon.

Here, the question arises of whether or not amorphous silicon film 31 can sufficiently serve as a floating gate in the case where amorphous silicon film 31 formed of non-doped amorphous silicon is used and it was determined that there is no problem in this regard due to the following reasons.

That is to say, after the formation of birds beak portions 30, a silicon film including an impurity that corresponds to conductive film 5 including silicon shown in FIG. 1 is deposited on top of amorphous silicon film 31. Amorphous silicon film 31 is formed to be thin wherein the thickness is less than 50 nm and, therefore, it is considered that the impurity included in this silicon film moves into amorphous silicon film 31, taking into account the fact that amorphous silicon film 31 is placed in a high temperature atmosphere during the course of the manufacturing process. In addition, in the case where the step of implantation of an impurity into a non-doped silicon film after the non-doped silicon film is deposited on amorphous silicon film 31 is adopted, it is considered that the impurity is also implanted into amorphous silicon film 31 at the time of the implantation step of this impurity.

Third Embodiment

Figure 27:
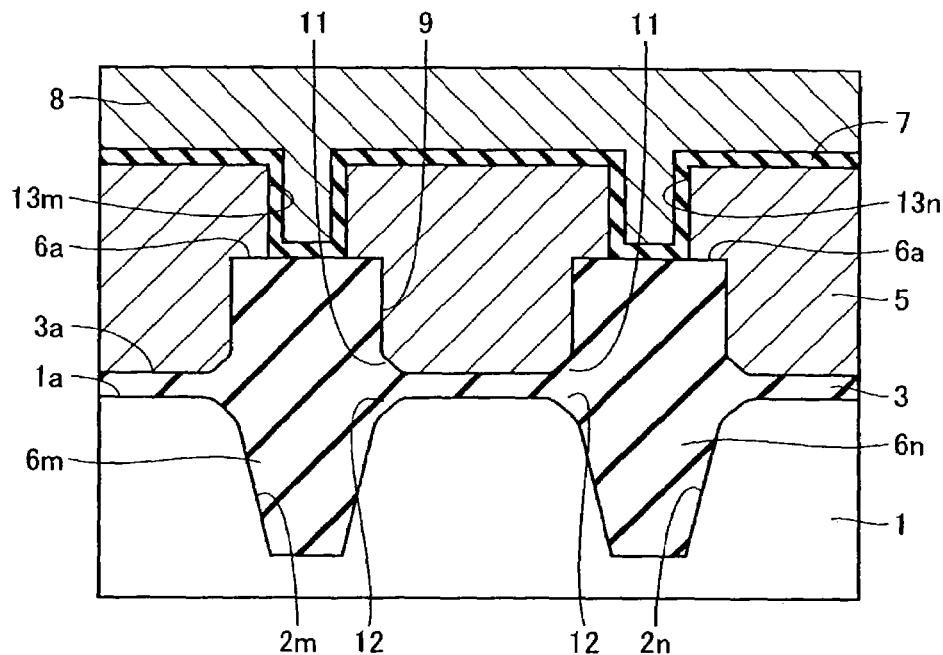
FIG. 27 is a cross sectional view showing a semiconductor device according to a third embodiment of the present invention.

With reference to FIG. 27, the semiconductor device according to a third embodiment, in comparison with the semiconductor device according to the first embodiment, is not provided with polysilicon film 4 shown in FIG. 1.

Figure 28:
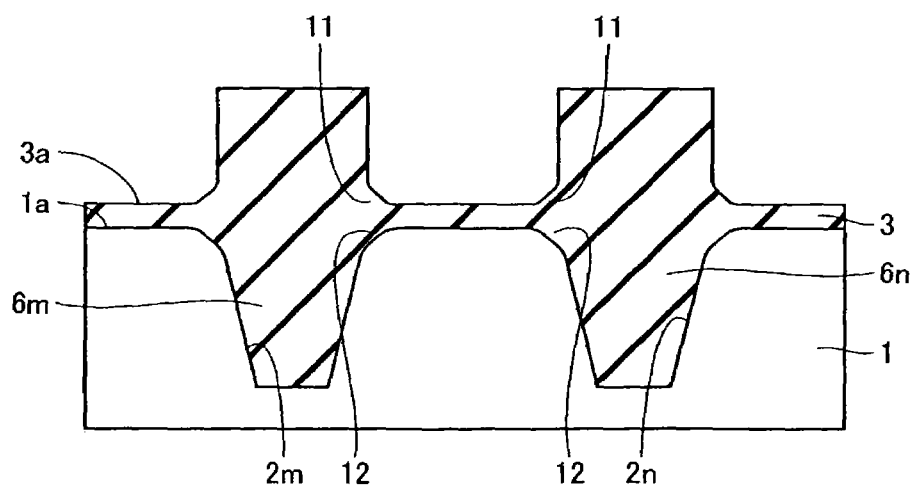
FIG. 28 is a cross sectional view showing a step of a manufacturing method for the semiconductor device shown in FIG. 27.

According a manufacturing method for the semiconductor device of the third embodiment, the step shown in FIG. 28 is carried out between the step shown in FIG. 13 and the step shown in FIG. 14 of the manufacturing method for the semiconductor device according to the first embodiment. In the following, the descriptions of the manufacturing steps which are the same as in the above will not be repeated.

With reference to FIG. 28, polysilicon film 4 that has been exposed by removing silicon nitride film 21 is selectively removed.

In the manufacturing method for a semiconductor device according to the third embodiment of the present invention, the step of removing polysilicon film 4 is further provided after the step of removing silicon nitride film 21.

According to the manufacturing method for a semiconductor device of such a configuration, the effects similar to the effects described in the first embodiment can be obtained. In addition, polysilicon film 4 is removed after being involved in the formation of birds beak portions 11 having the desired forms and, therefore, the contact resistance and the effects of the interface level that occur between polysilicon film 4 and conductive film 5 including silicon can be eliminated.

Fourth Embodiment

Figure 29:
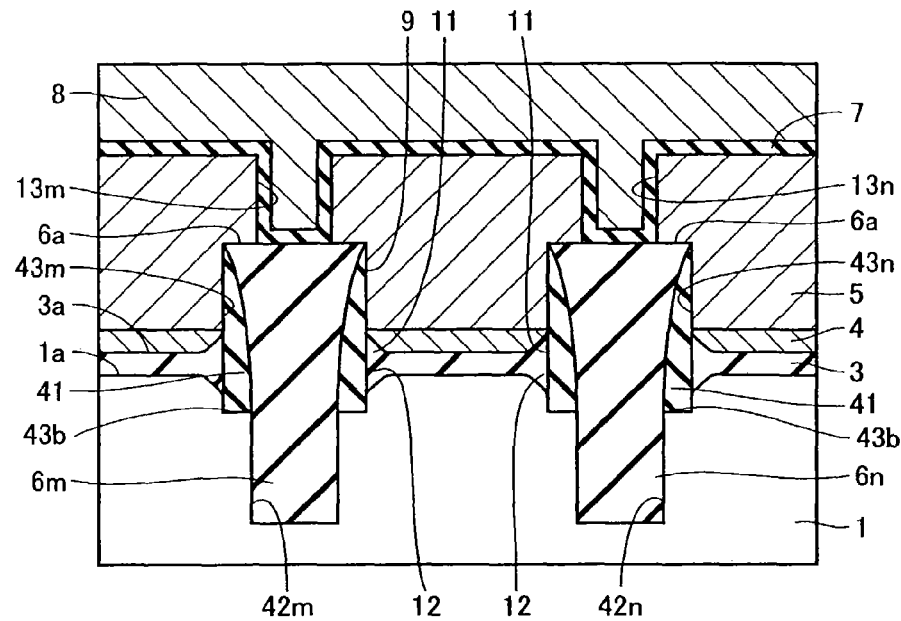
FIG. 29 is a cross sectional view showing a semiconductor device according to a fourth embodiment of the present invention.

A semiconductor device according to a fourth embodiment of the present invention has a structure which is basically similar to the semiconductor device according to the first embodiment. With reference to FIG. 29, the semiconductor device according to the fourth embodiment is obtained by additionally providing the semiconductor device shown in FIG. 1 with sidewalls 41.

Trenches 42m and 42n extending in one direction are formed in silicon substrate 1 so as to be located at a predetermined distance away from each other. Trenches 42m and 42n extend parallel to each other. Recesses 43m and 43n, respectively, whose sides are defined by conductive film 5 including silicon, polysilicon film 4, tunnel oxide film 3 and silicon substrate 1 and whose bottoms 43b are defined by silicon substrate 1, are formed so as to be connected to trenches 42m and 42n.

Sidewalls 41 formed of silicon oxide films, made of a material such as TEOS (Tetra Ethyl Ortho Silicate), are formed above bottoms 43b of recesses 43m and 43n so as to make contact with the inner surfaces of recesses 43m and 43n. A sidewall 41 has a surface wherein the distance between this surface and the inner surface of either recess 43m or 43n becomes greater as the position of this surface approaches bottom 43b. This surface extends from the top of recess 43m or 43n in an arc form so as to continue to the inner surface of trench 42m or 42n.

Element isolation oxide films 6m and 6n, made of silicon oxide films, are formed so as to completely fill in the insides of recesses 43m and 43n as well as trenches 42m and 42n.

The semiconductor device according to the fourth embodiment of the present invention further includes sidewalls 41, having surfaces that continue to portions of silicon substrate 1 so as to define the sides of trenches 42m and 42n as first and second trenches, that are formed so as to bring into contact with the sides of polysilicon film 4 and tunnel oxide film 3.

In accordance with a manufacturing method for the semiconductor device according to the fourth embodiment, the steps shown in FIGS. 30 to 36 follow the steps shown in FIGS. 2 to 4 of the manufacturing method for the semiconductor device according to the first embodiment. Furthermore, these steps are followed by the steps shown in FIGS. 14 to 17 and in FIG. 1 of the manufacturing method for the semiconductor device according to the first embodiment. In the following, the descriptions of the manufacturing steps that are the same as in the above will not be repeated.

Figure 30:
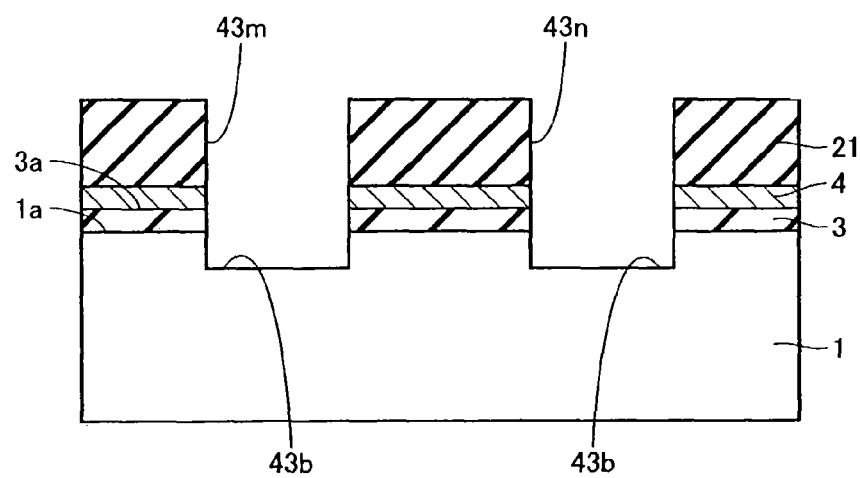
FIGS. 30 to 36 are cross sectional views showing the steps of a manufacturing method for the semiconductor device shown in FIG. 29.

With reference to FIG. 30, polysilicon film 4, tunnel oxide film 3 and silicon substrate 1 are sequentially etched using silicon nitride film 21 as a mask. Thereby, recesses 43m and 43n, whose bottoms 43b are defined by silicon substrate 1, are formed.

Figure 31:
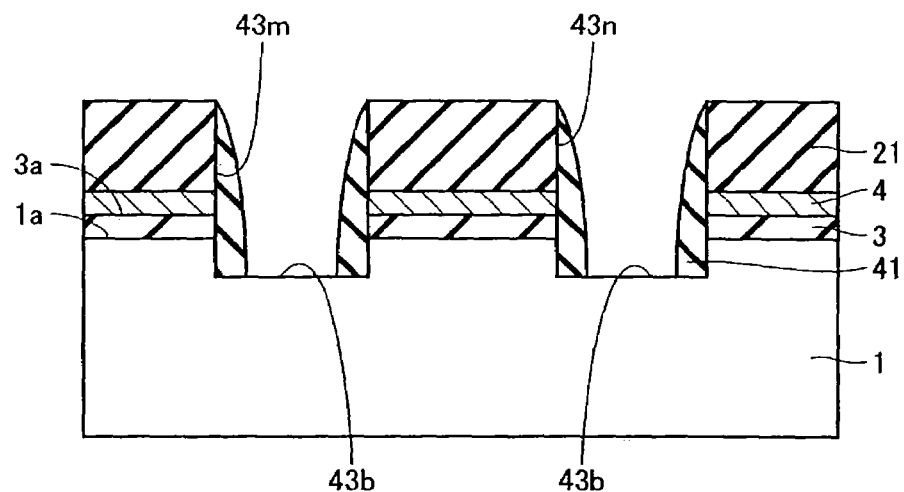

With reference to FIG. 31, a silicon oxide film, made of material such as TEOS, is deposited so as to fill in recesses 43m and 43n and so as to cover silicon nitride film 21. Anisotropic etching is carried out on this silicon oxide film so as to form sidewalls 41 in predetermined forms. Sidewalls 41 are formed so as to cover portions of the bottoms 43b of recesses 43m and 43n and so that the remaining portions thereof are exposed.

Figure 32:
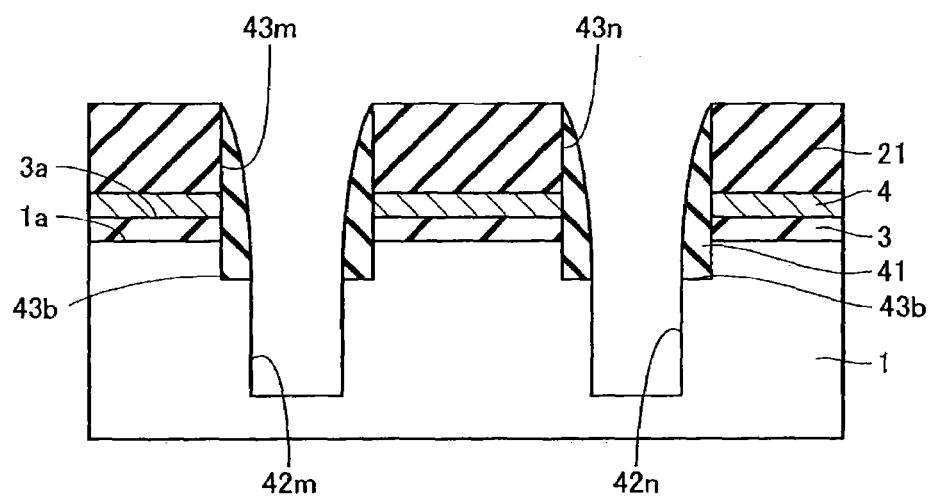

With reference to FIG. 32, silicon substrate 1 is etched using sidewalls 41 as a mask so that trenches 42m and 42n are formed in silicon substrate 1.

Figure 33:
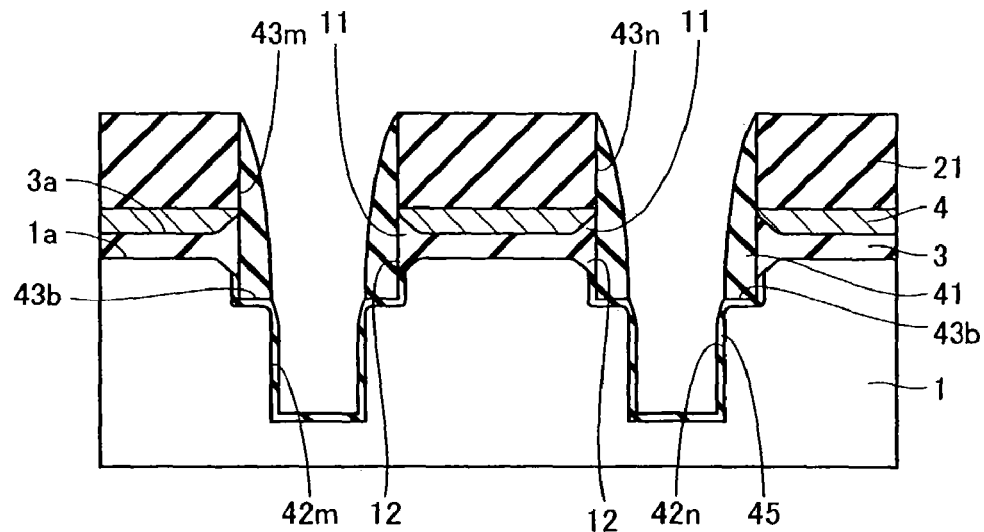

With reference to FIG. 33, an oxidation process is carried out on the inner surfaces of trenches 42m and 42n by means of a thermal oxidation method. Inner wall oxide films 45 are formed on the sides and the bottoms of trenches 42*m* and 42*n* according to this oxidation process. In addition, the portions of silicon substrate 1 and polysilicon film 4 behind sidewalls 41 and adjoining the end portions of tunnel oxide films 3 are also oxidized. Thereby, birds beak portions 11 and 12 having predetermined forms are formed on both ends of tunnel oxide films 3.

In the above described oxidation process, the distance between an inner side of tunnel oxide film 3 and the surface of sidewall 41, extending in an arc form, in other words, the width of a sidewall 41 that is formed can be adjusted and, thereby, the dimensions of birds beak portions 11 and 12 formed in tunnel oxide films 3 can be freely controlled. That is to say, the degree of oxidation of silicon substrate 1 and polysilicon film 4 is reduced by increasing the width of sidewalls 41 to be formed so that the dimensions of birds beak portions 11 and 12 can be reduced. Contrarily, the degree of oxidation of silicon substrate 1 and polysilicon film 4 is increased by reducing the width of sidewalls 41 to be formed so that the dimensions of birds beak portions 11 and 12 can be increased. In addition, the combination of the oxidation conditions for the above described oxidation process, the thickness of polysilicon film 4 and the width of sidewalls 41 to be formed can be appropriately selected, whereby the dimensions of birds beak portions 11 and 12 to be formed can be further freely controlled.

Figure 34:
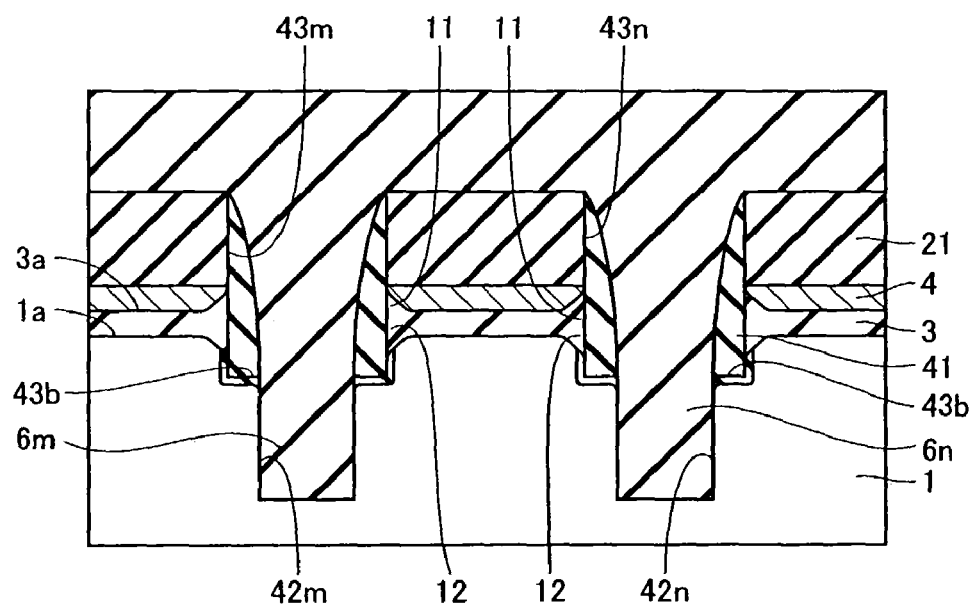

With reference to FIG. 34, a silicon oxide film is deposited so as to fill in trenches 2*m* and 2*n* as well as recesses 43*m* and 43*n* and so as to cover the top surface of silicon nitride film 21 according to a plasma CVD (Chemical Vapor Deposition) method in order to form element isolation oxide films 6*m* and 6*n*.

Figure 35:
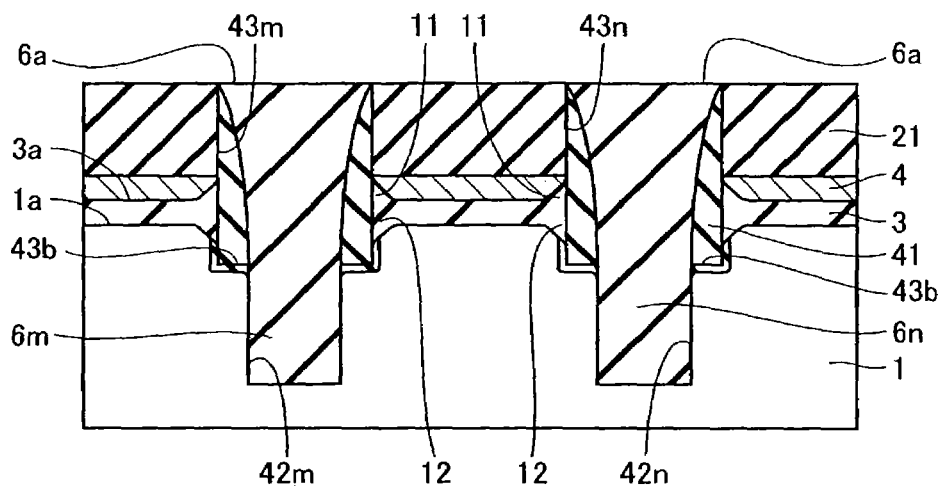

With reference to FIG. 35, the silicon oxide film deposited in the step shown in FIG. 34 is polished by means of a chemical mechanical polishing method until the top surface of silicon nitride film 21 is at least exposed. Thereby, element isolation oxide films 6*m* and 6*n*, which fill in trenches 2*m* and 2*n* as well as recesses 43*m* and 43*n*, having top surfaces 6*a* provided in the same plane as that top surface of silicon nitride film 21 are formed.

Figure 36:
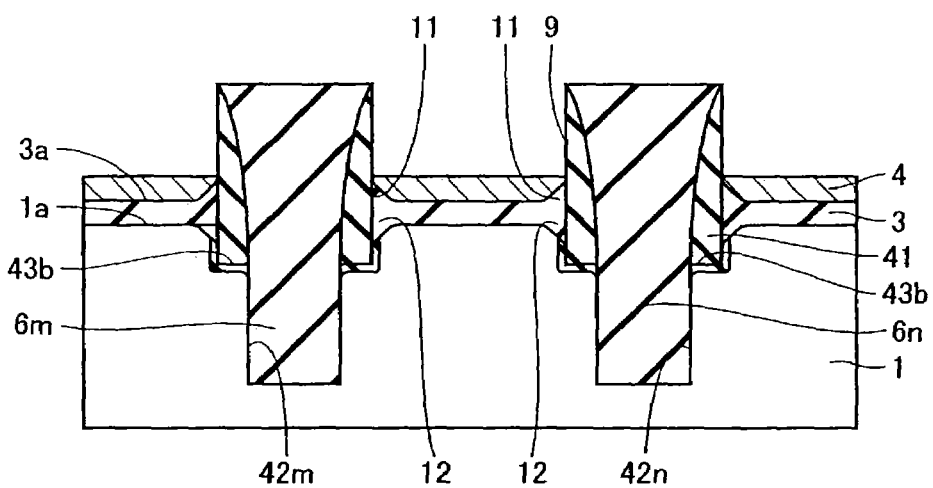

With reference to FIG. 36, silicon nitride film 21 exposed as a result of polishing of the silicon oxide film is selectively removed using hot phosphoric acid or the like. Thereby, recess 9 is formed between sidewalls 41 located above main surface 1*a* of silicon substrate 1.

In accordance with a manufacturing method for the semiconductor device according to the fourth embodiment of the present invention, the step of forming trenches 42*m* and 42*n* includes the steps of forming recesses 43*m* and 43*n*, whose bottoms 43*b* are defined by silicon substrate 1, by sequentially etching polysilicon film 4, tunnel oxide film 3 and silicon substrate 1 using silicon nitride film 21 as a mask; forming sidewalls 41 as sidewall insulating films that make contact with the sides of polysilicon films 4 and tunnel oxide films 3 and that cover portions of bottoms 43*b* of recesses 43*m* and 43*n* so that the remaining portion of bottoms 43*b* of recesses 43*m* and 43*n* are exposed; and forming trenches 42*m* and 42*n* by etching the portions of silicon substrate 1 that are exposed from sidewalls 41 using sidewalls 41 as a mask.

According to the semiconductor device of such a configuration and the manufacturing method for the same, the same effects as are described in the first embodiment can be obtained. In addition, the inner sides of tunnel oxide films 3 are covered by sidewalls 41 in the oxidation process and, therefore, tunnel oxide films 3 can be prevented from being exposed to the oxidizing atmosphere. Thereby, direct oxidation of tunnel oxide films 3 is prevented so that tunnel oxide films 3 can be protected in the condition wherein the desired characteristics are maintained. In addition, the dimensions of birds beak portions 11 and 12 to be formed can be controlled by adjusting the width of sidewalls 41 to be formed. Therefore, birds beak portions 11 and 12 can be formed to have predetermined forms with even greater freedom of design.

In addition, shoulder portions (bottom 43*b* portions of recess 43*m*) are formed in silicon substrate 1 of the active region located between element isolation oxide films 6*m* and 6*n* by forming sidewalls 41. Accordingly, contact holes can be prevented from penetrating through the bottoms of trenches 42*m* and 42*n* even in the case where a misalignment of the mask occurs in the step of forming the contact holes that reach to main surface 1*a* of silicon substrate 1 in the active region. Thereby, short circuiting between the conductive films filled in into the contact holes and silicon substrate 1 can be prevented.

Fifth Embodiment

Figure 37:
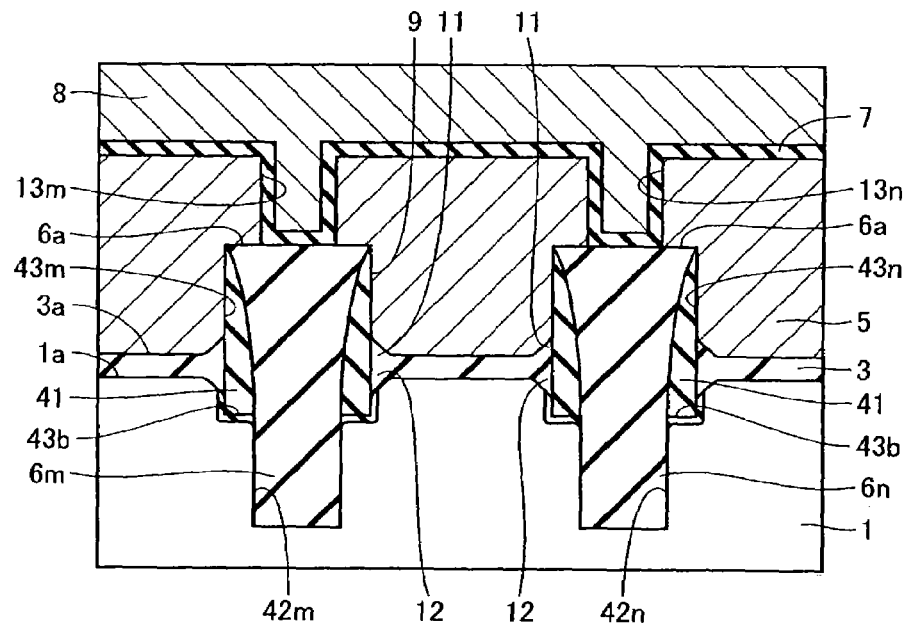
FIG. 37 is a cross sectional view showing a semiconductor device according to a fifth embodiment of the present invention.

With reference to FIG. 37, a semiconductor device according to a fifth embodiment, as compared to the semiconductor device according to the fourth embodiment, does not have polysilicon film 4 that is shown in FIG. 29.

Figure 38:
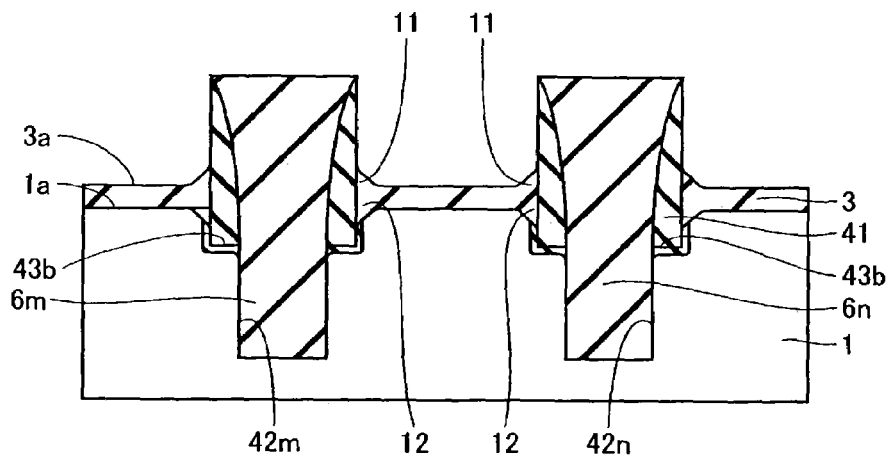
FIG. 38 is a cross sectional view showing a step of a manufacturing method for the semiconductor device shown in FIG. 37.

In accordance with the manufacturing method for the semiconductor device according to the fifth embodiment, the step shown in FIG. 38 follows the step shown in FIG. 36 of the manufacturing method for the semiconductor device according to the fourth embodiment. Furthermore, this is followed by the steps shown in FIGS. 14 to 17 and in FIG. 1 of the manufacturing method for the semiconductor device according to the first embodiment. In the following, the descriptions of the manufacturing steps that are the same as in the above will not be repeated.

With reference to FIG. 38, polysilicon film 4 exposed by removing silicon nitride film 21 is selectively removed.

According to the manufacturing method for the semiconductor device of such a configuration, the same effects as the effects described in the first, third and fourth embodiments can be obtained.

Sixth Embodiment

Figure 39:
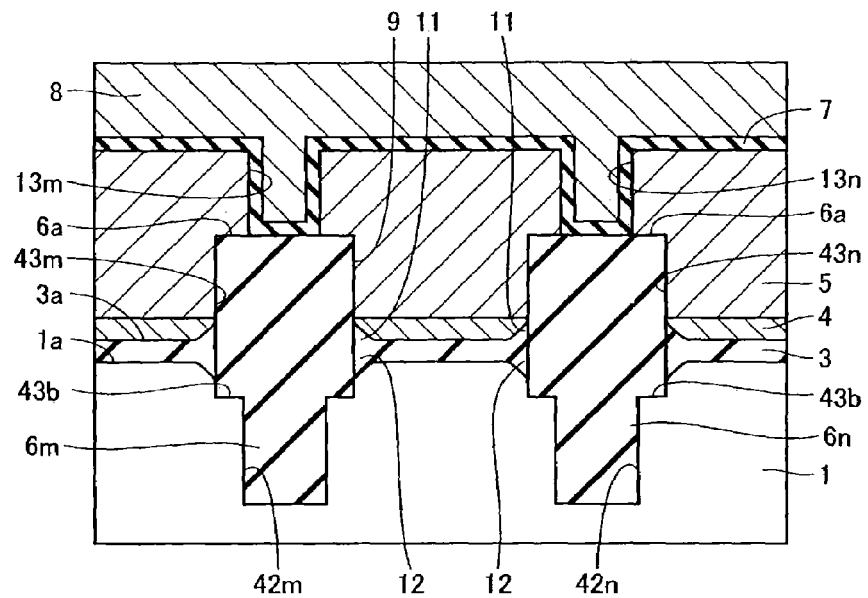
FIG. 39 is a cross sectional view showing a semiconductor device according to a sixth embodiment of the present invention.

With reference to FIG. 39, the semiconductor device according to a sixth embodiment, as compared to the semiconductor device according to the fourth embodiment, does not have sidewalls 41 that are shown in FIG. 29.

Figure 40:
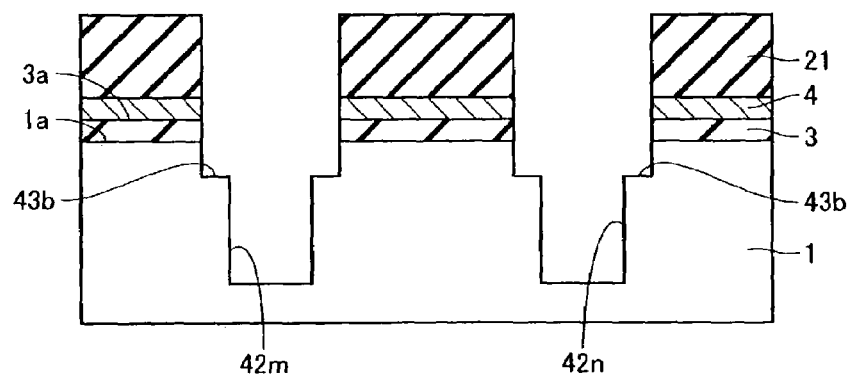
FIG. 40 is a cross sectional view showing a step of a manufacturing method for the semiconductor device shown in FIG. 39.

In the manufacturing method for the semiconductor device according to the sixth embodiment, the step shown in FIG. 40 is carried out between the step shown in FIG. 32 and the step shown in FIG. 33 of the manufacturing method for the semiconductor device according to the fourth embodiment. In the following, the descriptions of the manufacturing steps that are the same as in the above will not be repeated.

With reference to FIG. 40, sidewalls 41 formed of silicon oxide films, made of material such as TEOS, are selectively removed.

In the manufacturing method for the semiconductor device according to the sixth embodiment of the present invention, the step of removing sidewalls 41 is additionally provided before the step of forming birds beak portions 11 and 12.

According to the semiconductor device of such a configuration, the same effects as are described in the first embodiment can be obtained. In addition, sidewalls 41 are removed before a predetermined oxidation process is carried out in order to form birds beak portions 11 and 12 and, therefore, sidewalls 41 and the inner sides of tunnel oxide films 3 do not make contact in this structure. Therefore, the carbon that is included in the TEOS, which forms sidewalls 41, can be prevented from moving into the silicon oxide films that form tunnel oxide films 3, which would negatively affect the characteristics of tunnel oxide films 3.

Seventh Embodiment

Figure 41:
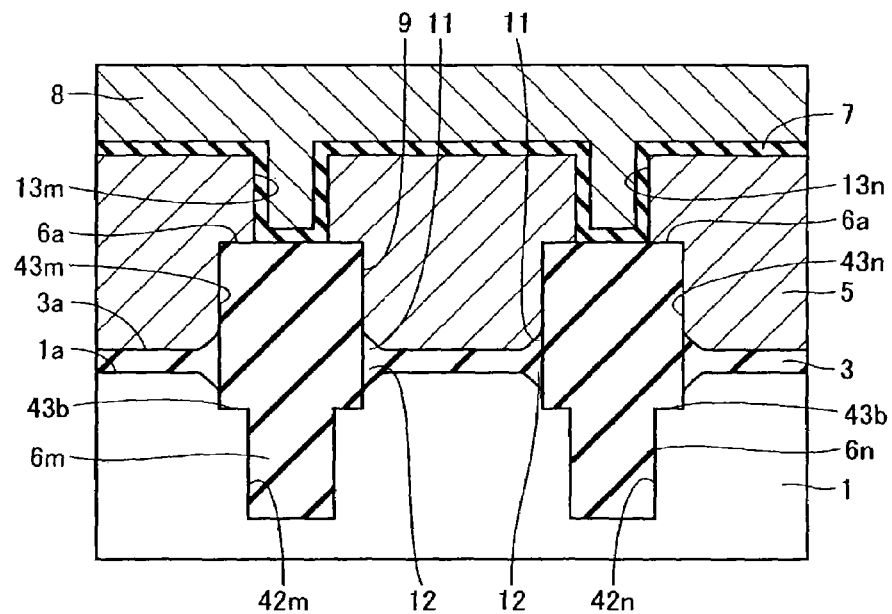
FIG. 41 is a cross sectional view showing a semiconductor device according to a seventh embodiment of the present invention.

With reference to FIG. 41, the semiconductor device according to a seventh embodiment, as compared to the semiconductor device according to the fourth embodiment, does not have sidewalls 41 and polysilicon films 4 that are shown in FIG. 29.

Figure 42:
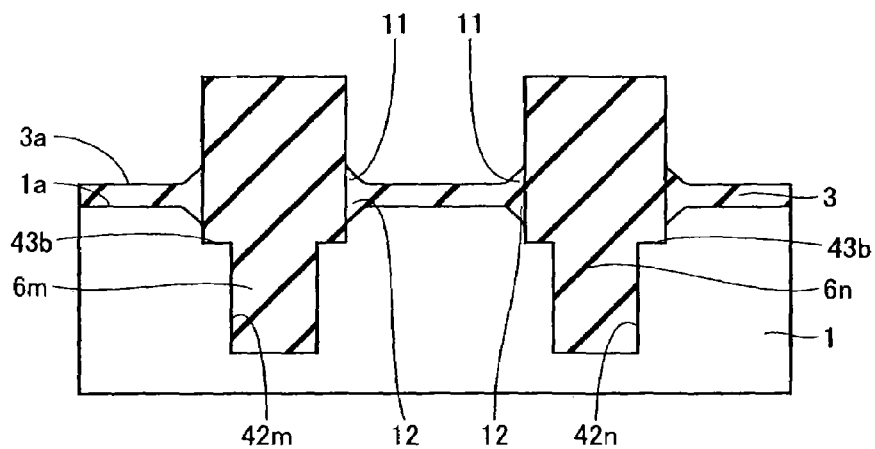
FIG. 42 is a cross sectional view showing a step of a manufacturing method for the semiconductor device shown in FIG. 41.

In the manufacturing method for the semiconductor device according to the seventh embodiment, the step shown in FIG. 40 described in the sixth embodiment is carried out between the step shown in FIG. 32 and the step shown in FIG. 33 of the manufacturing method for the semiconductor device according to the fourth embodiment. Furthermore, the step shown in FIG. 42 is carried out after the step shown in FIG. 36 of the manufacturing method for the semiconductor device according to the fourth embodiment. This is followed by the steps shown in FIGS. 14 to 17 and in FIG. 1 of the manufacturing method for the semiconductor device according to the first embodiment. In the following, the descriptions of the manufacturing steps that are the same as in the above will not be repeated.

With reference to FIG. 42, polysilicon films 4 exposed by removing silicon nitride film 21 are selectively removed.

According to the semiconductor device of such a configuration, the same effects as are described in the first, third and sixth embodiments can be obtained.

Eighth Embodiment

The manufacturing method for the semiconductor device according to an eighth embodiment of the present invention has exactly the same configuration as the manufacturing method for the semiconductor device according to the first embodiment. Here, in the eighth embodiment, the step of the formation of a well region in silicon substrate 1, the description of which will not be repeated in the first embodiment, is specifically described.

With reference to FIG. 2, first, before the formation of tunnel oxide film 3 on silicon substrate 1, an alignment mark for a photomechanical process is formed on silicon substrate 1 and an oxide film is formed so as to protect the surface of silicon substrate 1. A resist film is formed having an opening at a predetermined location using the above alignment mark as a reference. An impurity, such as phosphorus, is implanted into silicon substrate 1 using the resist film as a mask, whereby a well region is formed. After that, the process proceeds to the step shown in FIG. 2 described in the first embodiment.

In the manufacturing method for the semiconductor device according to the eighth embodiment of the present invention, the step of the formation of a well region by implanting an impurity into silicon substrate 1 is further provided before the step of the formation of tunnel oxide film 3.

According to the manufacturing method for the semiconductor device of such a configuration, implantation of an impurity is carried out in order to form a well region before the step of the formation of tunnel oxide film 3. An impurity is not implanted through tunnel oxide film 3 when such a sequence of steps is adopted. Therefore, tunnel oxide film 3 can be prevented from deteriorating due to the implantation of an impurity into tunnel oxide film 3.

Ninth Embodiment

The manufacturing method for the semiconductor device according to a ninth embodiment of the present invention differs from the manufacturing method for the semiconductor device according to the eighth embodiment in the timing according to which the step of the formation of a well region in silicon substrate 1 is carried out.

With reference to FIG. 13, a resist film is formed having an opening in a predetermined location, using trenches 2m and 2n as references, after the removal of silicon nitride film 21. An impurity, such as phosphorus, is implanted into silicon substrate 1 through polysilicon film 4 and tunnel oxide film 3 so as to form a well region. This is followed by the step shown in FIG. 14 in the first embodiment.

In the manufacturing method for the semiconductor device according to the ninth embodiment of the present invention, the step of the formation of a well region by implanting an impurity into silicon substrate 1 is further provided after the step of the removal of silicon nitride film 21.

According to the manufacturing method for the semiconductor device of such a configuration, well regions are formed at predetermined positions using trenches 2m and 2n as references. Therefore, it is not necessary to carry out the step of forming an alignment mark as is described in the eighth embodiment or the step of forming an oxide film in order to protect the surface of silicon substrate 1. Thereby, the number of manufacturing steps for the semiconductor device can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate, having a main surface, in which first and second trenches are formed in said main surface at a distance away from each other;
   first and second isolation insulating films filling in said first and second trenches;
   a silicon-containing insulating film, formed on said main surface located between said first isolation insulating film and said second isolation insulating film, having an end portion in a birds beak form which brings into contact with said first isolation insulating film and said second isolation insulating film, respectively, having a first top surface;
   a silicon film formed on said silicon-containing insulating film, having a thickness exceeding 0 and being less than 50 nm in an intermediate portion between said first isolation insulating film and said second isolation insulating film, and being thinner than said thickness on said end portion;
   a conductive film, including silicon, located on and connected to said silicon film; and
   shoulder portions formed in the portions of said semiconductor substrate defining the side faces of said first and second trenches.

2. The semiconductor device according to claim 1, wherein
each of said first and second isolation insulating films has a second top surface, and the distance from said main surface to said second top surface is at least 20 nm.

3. The semiconductor device according to claim 1, wherein
each of said first and second isolation insulating films has a second top surface, and the distance from said main surface to said second top surface is at least the sum of the thickness of said gate insulating film and said silicon film.

4. The semiconductor device according to claim 1, wherein the thickness of said conductive film is at least 50 nm and at most 200 nm.

5. The semiconductor device according to claim 1, wherein
each of said first and second isolation insulating films has a second top surface, and said conductive film is formed to cover at least part of said second top surface.

6. The semiconductor device according to claim 1, wherein
each of said first and second isolation insulating films has a second top surface, and the distance from said main surface to said second top surface is greater than the distance from said main surface to said first top surface.

7. The semiconductor device according to claim 1, wherein said silicon film includes phosphorus.

8. A semiconductor device comprising:
a semiconductor substrate, having a main surface, in which first and second trenches are formed in said main surface at a distance away from each other;
first and second isolation insulating films filling in said first and second trenches;
a silicon-containing insulating film, formed on said main surface located between said first isolation insulating film and said second isolation insulating film, having an end portion in a birds beak;
a silicon film formed on said silicon-containing insulating film, having a thickness exceeding 0 and being less than 50 nm in an intermediate portion between said first isolation insulating film and said second isolation insulating film, and being thinner than said thickness on said end portion; and
sidewall insulating films, formed between said silicon-containing insulating film and each of said first and second insulating films so as to bring into contact with the sidewalls of said silicon film and said silicon-containing insulating flims; wherein
said sidewall insulating films extend into the substrate to a depth less than a depth to which said first and second trenches extend.

9. The semiconductor device according to claim 1, further comprising sidewall insulating films, formed between said silicon-containing insulating film and each of said first and second insulating films so as to bring into contact with the sidewalls of said silicon film and said silicon-containing film.

* * * * *